(12) United States Patent
Elsherbini et al.

(10) Patent No.: US 11,189,580 B2
(45) Date of Patent: Nov. 30, 2021

(54) ELECTROSTATIC DISCHARGE PROTECTION IN INTEGRATED CIRCUITS

(71) Applicant: INTEL CORPORATION, Santa Clara, CA (US)

(72) Inventors: Adel A. Elsherbini, Chandler, AZ (US); Krishna Bharath, Phoenix, AZ (US); Feras Eid, Chandler, AZ (US); Johanna M. Swan, Scottsdale, AZ (US); Aleksandar Aleksov, Chandler, AZ (US); Veronica Aleman Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 16/721,327

(22) Filed: Dec. 19, 2019

(65) Prior Publication Data

US 2021/0193595 A1    Jun. 24, 2021

(51) Int. Cl.
*H01L 23/60* (2006.01)
*H05K 1/18* (2006.01)
*H01L 27/02* (2006.01)
*H01L 23/00* (2006.01)
*H01L 23/498* (2006.01)

(52) U.S. Cl.
CPC ........ *H01L 23/60* (2013.01); *H01L 23/49816* (2013.01); *H01L 24/13* (2013.01); *H01L 24/14* (2013.01); *H01L 24/16* (2013.01); *H01L 27/0248* (2013.01); *H05K 1/181* (2013.01); *H01L 2224/13024* (2013.01); *H01L 2224/14181* (2013.01); *H01L 2224/16145* (2013.01); *H01L 2224/16225* (2013.01); *H05K 2201/10128* (2013.01)

(58) Field of Classification Search
CPC ...................................................... H01L 23/60
USPC ............................................................ 361/118
See application file for complete search history.

(56) References Cited

U.S. PATENT DOCUMENTS

| | | | | |
|---|---|---|---|---|
| 6,534,422 B1 * | 3/2003 | Ichikawa | .......... | H01L 21/76801 257/E21.576 |
| 7,808,075 B1 * | 10/2010 | Cheng | .................... | H01L 23/60 257/528 |
| 2006/0250731 A1 * | 11/2006 | Parkhurst | ................ | H01L 23/62 361/56 |
| 2007/0041141 A1 * | 2/2007 | Deng | ..................... | H01C 7/105 361/118 |
| 2008/0278873 A1 * | 11/2008 | Leduc | ..................... | H01L 23/60 361/56 |
| 2009/0097175 A1 * | 4/2009 | Chiu | ....................... | H01L 23/60 361/56 |

(Continued)

*Primary Examiner* — Sherman Ng
(74) *Attorney, Agent, or Firm* — Patent Capital Group

(57) ABSTRACT

Disclosed herein are structures, devices, and methods for electrostatic discharge protection (ESDP) in integrated circuits (ICs). For example, in some embodiments, an IC package support may include: a first conductive structure in a dielectric material; a second conductive structure in the dielectric material; and a material in contact with the first conductive structure and the second conductive structure, wherein the material includes a polymer, and the material is different from the dielectric material. The material may act as a dielectric material below a trigger voltage, and as a conductive material above the trigger voltage.

19 Claims, 13 Drawing Sheets

(56) References Cited

U.S. PATENT DOCUMENTS

| | | | |
|---|---|---|---|
| 2011/0211319 A1* | 9/2011 | Kosowsky | H05K 1/0254 |
| | | | 361/763 |
| 2012/0182650 A1* | 7/2012 | Chi | H01L 23/60 |
| | | | 361/54 |
| 2016/0029479 A1* | 1/2016 | Yoo | H05K 1/0259 |
| | | | 361/56 |
| 2019/0067244 A1 | 2/2019 | Chen et al. | |
| 2019/0372198 A1* | 12/2019 | Dalmia | H01L 23/66 |

* cited by examiner

ELECTROSTATIC DISCHARGE PROTECTION IN INTEGRATED CIRCUITS

BACKGROUND

At various stages in the manufacture of an integrated circuit (IC) device, the electronic components of the device may be at risk for damage due to electrostatic discharge. Electrostatic forces may accumulate during manufacturing, handling, and testing, and discharge of these forces may cause permanent damage to sensitive circuits.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
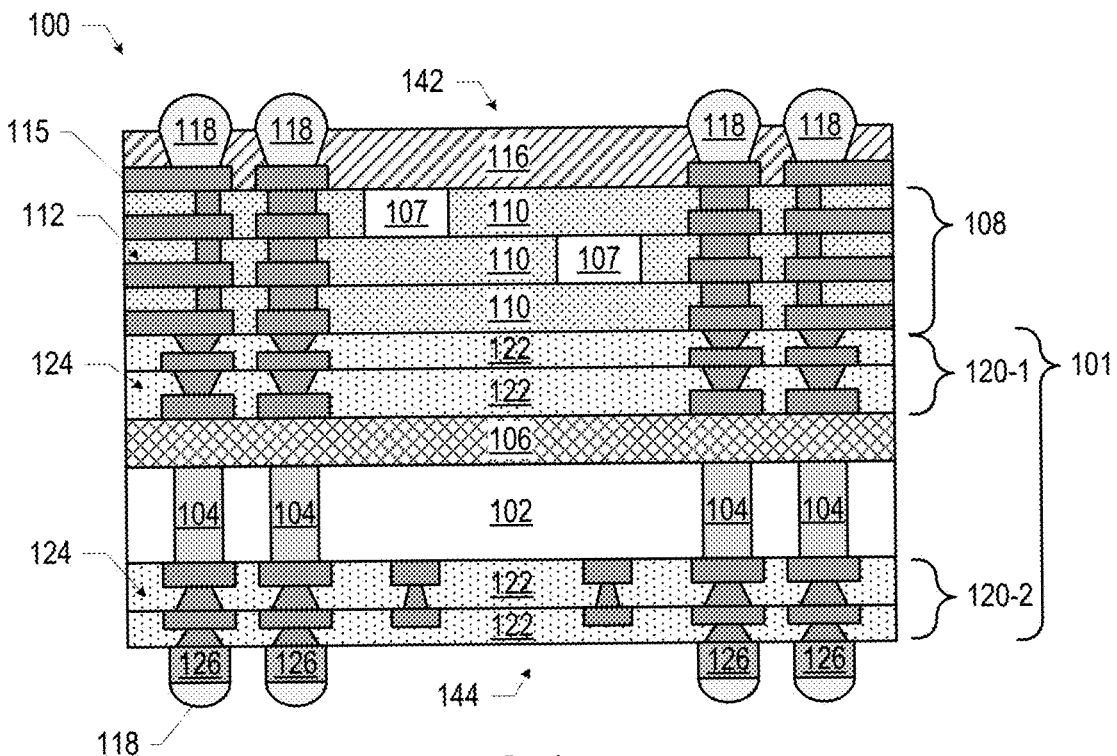
FIGS. 1-6 are side, cross-sectional views of example integrated circuit (IC) structures including electrostatic discharge protection (ESDP) structures, in accordance with various embodiments.

Disclosed herein are structures, devices, and methods for electrostatic discharge protection (ESDP) in integrated circuits (ICs). In some embodiments, an IC package support may include: a first conductive structure in a dielectric material; a second conductive structure in the dielectric material; and a material in contact with the first conductive structure and the second conductive structure, wherein the material includes a polymer, and the material is different from the dielectric material. The material may act as a dielectric material below a trigger voltage, and as a conductive material above the trigger voltage.

Conventionally, IC devices have been protected from electrostatic discharge by diodes or other active devices included in the device layer of a die. These diodes or other devices have been electrically coupled between exposed locations of the die (e.g., exposed conductive contacts, such as first-level interconnect (FLI) solder bumps) and a ground (e.g., the bulk semiconductor upon which device layers are conventionally fabricated). Such diodes or devices may be designed such that they act as a low resistance to ground (or to the supply rail) at a voltage that is just below the voltage threshold at which the functional devices on the die (e.g., the transistors) may be damaged. When a voltage in the expected operational voltage range is applied at the exposed locations, the diodes or devices may act as a capacitor between the exposed location and ground, and any signal received at the exposed location will be transmitted to the functional devices as expected. When an external voltage greater than or equal to this value is applied at the exposed locations, the diodes or devices will act as a low resistance, shunting the high voltage input to ground (or to the supply rail) and shielding the functional devices.

Continued use of this conventional approach to ESDP, however, becomes more difficult as the size of IC devices continues to shrink. Such on-die diodes or other devices may have a large footprint, requiring a significant portion of the valuable "real estate" of the underlying semiconductor material or other substrate. Such devices also may induce capacitive loading and consume leakage power during normal device operation, undesirably increasing the power consumption of such devices and limiting the frequencies at which the devices can operate. Further, conventional diode arrangements may relay on the presence of a bulk semiconductor to serve as the ground, and thus cannot be readily applied in silicon-on-insulator (SOI) or thinned substrate devices.

The ESDP structures and techniques disclosed herein may protect IC devices from electrostatic discharge without occupying expensive on-die real estate and/or without substantially impacting high frequency performance. Further, the ESDP structures and techniques disclosed herein may be readily customized to provide the kind of ESDP that is most advantageous at each of the different structural levels of an electronic device (e.g., with protection against smaller voltages at the die-level, and against greater voltages at the package- or circuit board-level).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

FIGS. 1-6 are side, cross-sectional views of example IC structures 100 including ESDP structures 107, in accordance with various embodiments. Although FIGS. 1-6 depict a particular number and arrangement of ESDP structures 107 in various IC structures 100, these numbers and arrangements are simply illustrative, and any of the IC structures 100 of FIGS. 1-6 may include any desired number and arrangement of ESDP structures 107. Further, the ESDP structures 107 included in an IC structure 100 (or in an IC package support 168, as discussed further below) may take any suitable form (e.g., any of the firms discussed below with reference to FIGS. 13-30).

Figure 2:
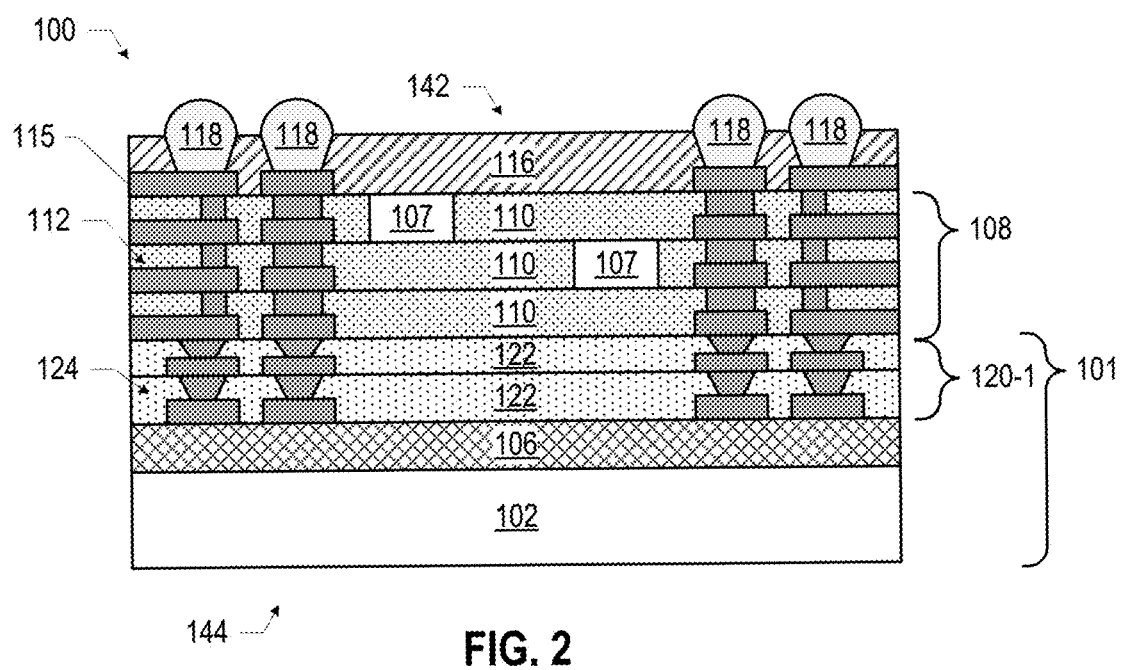
Figure 3:
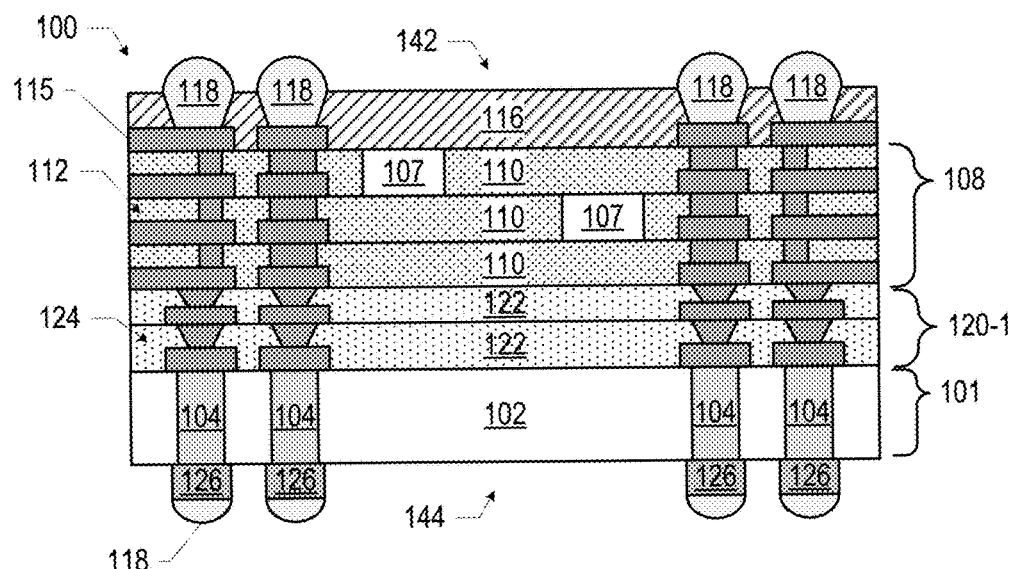
Figure 4:
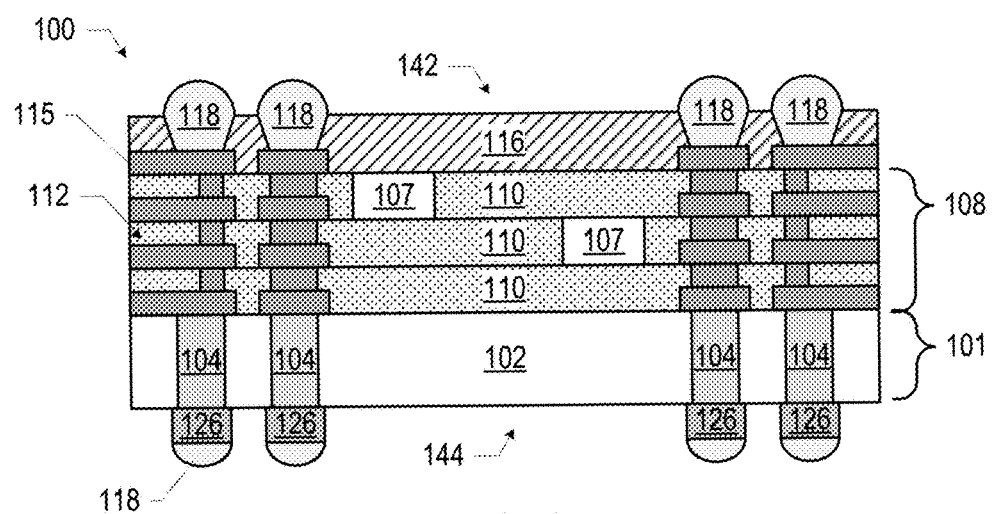
Figure 5:
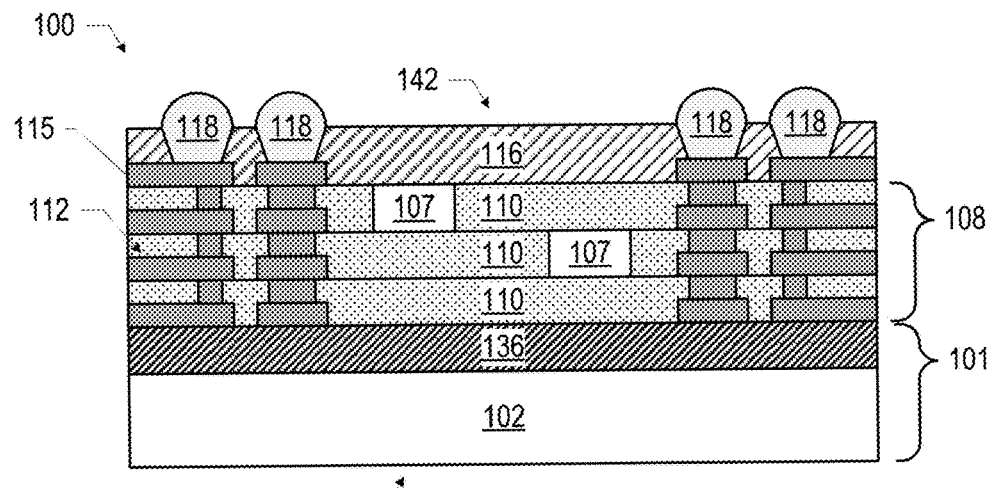

In some embodiments, an IC structure 100 may include a die 101 with redistribution layers (RDLs) 108. A die 101 may include a substrate 102, and may, in some embodiments, include one or more device layers 106 and/or one or more interconnect layers 120. For example, in the embodiment illustrated in FIG. 1, the die 101 includes a device layer 106 proximate to one face (e.g., the "frontside") of the substrate 102, interconnect layers 120-1 proximate to that same face of the substrate 102 (such that the device layer 106 is between the interconnect layers 120-1 and the substrate 102), and RDLs 108 on the interconnect layers 120-1 (such that the interconnect layers 120-1 are between the RDLs 108 and the device layer 106). Further, in the embodiment illustrated in FIG. 1, the die 101 includes interconnect layers 120-2 proximate to the opposite face (e.g., the "backside") of the substrate 102 as the interconnect layers 120-1. In other embodiments, the device layer(s) 106 and/or the interconnect layer(s) 120 may be omitted; for example, FIGS. 3-5 illustrate IC structures 100 in which no device layer 106 is present, and FIGS. 4-5 illustrate IC structures 100 in which no interconnect layers 120 are present. In some embodiments, an IC structure 100 may include one or more device layers 106 and one or more frontside interconnect layers 120 without including any backside interconnect layers 120 (e.g., as illustrated in FIGS. 2-6). Some embodiments (not illustrated) of the IC structure 100 may include no device layers 106 but may include one or more frontside interconnect layers 120 and/or one or more backside interconnect layers 120. More generally, a die 101 including any desired combination of device layer(s) 106 and frontside and/or backside interconnect layers 120 may be used in an IC structure 100.

The substrate 102 may include any suitable material (e.g., an inorganic material). In some embodiments, the substrate 102 may be a semiconductor substrate composed of semiconductor material systems including, for example, n-type or p-type materials systems (or a combination of both). The substrate 102 may include, for example, a crystalline substrate formed using a bulk silicon or a SOI substructure. In some embodiments, the substrate 102 may be formed using alternative materials, which may or may not be combined with silicon, that include but are not limited to germanium, indium antimonide, lead telluride, indium arsenide, indium phosphide, gallium nitride, gallium arsenide, or gallium antimonide. Further materials classified as group II-VI, III-V, or IV may also be included in the substrate 102. In some embodiments, the substrate 102 may include glass, diamond, sapphire, or a ceramic material. In RF applications, as discussed further below, the substrate 102 may advantageously include glass or silicon. As discussed further below, the substrate 102 may be part of a singulated die (e.g., the dies 1502 of FIG. 41) or a wafer (e.g., the wafer 1500 of FIG. 41).

Through-substrate vias (TSVs) 104 may extend through the substrate 102, providing electrical pathways across the substrate 102. The TSVs 104 may include an electrically conductive material (e.g., a metal) and may make contact with electrically conductive structures at opposite faces of the substrate 102. In some embodiments, no TSVs 104 may be present (e.g., as discussed below with reference to FIGS. 2, 5, and 6).

When present in a die 101, a device layer 106 may include one or more transistors (e.g., metal oxide semiconductor field-effect transistors (MOSFETs)), one or more diodes (e.g., for ESDP, as discussed above), or other suitable devices. For example, a device layer 106 may include transistors having source and/or drain (S/D) regions, a gate to control current flow in the transistors between the S/D regions, and one or more S/D contacts to route electrical signals to/from the S/D regions. The transistors may further include additional features, such as device isolation regions, gate contacts, and the like. The transistors in a device layer 106 may include any desired type of transistors, such as planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

The gate of a transistor in a device layer 106 may include at least two layers: a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions may be proximate to the gate of each transistor. The S/D regions may be formed using an implantation/diffusion process or an etching/deposition process, for example. In the former process, dopants such as boron, aluminum, antimony, phosphorous, or arsenic may be ion-implanted into a substrate to form the S/D regions. An annealing process that activates the dopants and causes them to diffuse farther into the substrate may follow the ion-implantation process. In the latter process, a substrate may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions may be formed using one or more alternate semiconductor materials such as germanium or a group III-V material or alloy. In further embodiments, one or more layers of metal and/or metal alloys may be used to form the S/D regions.

As noted above, in some embodiments, an IC structure 100 may include frontside interconnect layers 120-1 and/or backside interconnect layers 120-2. Electrical signals, such as power and/or input/output (I/O) signals, may be routed to and/or from the devices (e.g., the transistors and/or diodes) of the device layer 106, or otherwise to and/or from the die 101, through these interconnect layers 120. For example, electrically conductive features of the device layer 106 (e.g., gate and S/D contacts, or diode contacts) may be electrically coupled to electrical pathways 124 through the interconnect layers 120. A set of interconnect layers 120 may also be referred to as a metallization stack.

Conductive lines and/or vias may be arranged within the interconnect layers 120 to route electrical signals along electrical pathways 124 according to a wide variety of designs. In particular, the arrangement is not limited to the particular configuration of conductive lines and vias depicted in FIG. 1 or any of the other accompanying drawings.

Lines and vias in the interconnect layers 120 may include an electrically conductive material such as a metal. The lines may be arranged to route electrical signals in a direction of a plane that is substantially parallel with a surface of the substrate 102. For example, the lines may route electrical signals in a direction in and out of the page from the perspective of FIG. 1. The vias may be arranged to route electrical signals in a direction of a plane that is substantially perpendicular to the surface of the substrate 102. In some embodiments, the vias may electrically couple lines of different interconnect layers 120 together.

The interconnect layers 120 may include a dielectric material 122 disposed between the lines and vias, as shown in FIG. 1. In some embodiments, the dielectric material 122 may be an inorganic dielectric material, such as silicon oxide. In some embodiments, the dielectric material 122 disposed between the lines and vias in different ones of the interconnect layers 120 may have different compositions (e.g., may be different inorganic dielectric materials); in other embodiments, the composition of the dielectric material 122 of different interconnect layers 120 may be the same.

Although the lines and the vias of the interconnect layers 120 are structurally delineated with a line within each interconnect layer 120 for the sake of clarity, the lines and the vias may be structurally and/or materially contiguous (e.g., simultaneously filled during a dual-damascene process) in some embodiments. In some embodiments, the thickness of the individual interconnect layers 120 may increase with the distance from the substrate 102 (e.g., the frontside interconnect layers 120-1 may increase in thickness closer to the front face 142, and the backside interconnect layers 120-2 may increase in thickness closer to the back face 144).

RDLs 108 may be disposed at a face of the die 101. The RDLs 108 may include a dielectric material 110 and electrical pathways 112 through the dielectric material 110; the electrical pathways 112 may include conductive lines and/or vias embedded in the dielectric material 110, and vias may electrically couple lines in different ones of the RDLs 108, as discussed above with reference to the interconnect layers 120. In some embodiments, the dielectric material 110 may be an organic dielectric material; examples of organic dielectric materials 110 may include organic build-up films (e.g., including an organic matrix with an inorganic particle filler, such as silica-filled epoxies), polyimides with or without filler, benzocyclobutene polymers, or unfilled epoxides. Although a particular number of RDLs 108 (i.e., three) is depicted in FIG. 1 and others of the accompanying drawings, an IC structure 100 may include any desired number of RDLs 108.

As noted above, the IC structures 100 may include one or more ESDP structures 107 in the RDLs 108. An ESDP structure 107 may be a structure that, during electrical operation of the IC structure 100, is to cause an electrical short (i.e., a low or zero resistance path) between a signal pathway and a ground (or supply rail) pathway in response to a voltage between the signal pathway and the ground pathway that exceeds a threshold. Unlike a conventional fuse, this electrical short may be reversible, such that intended electrical operation of the IC structure 100 (i.e., with the signal pathway not shorted to the ground pathway) may continue when the voltage seen at the signal pathway does not exceed the threshold. The ESDP structures 107, then, may help protect sensitive signal circuitry from large voltages that may otherwise render the signal circuitry inoperative, and may permit continued operation when such large voltages are not present.

In some embodiments, an ESDP structure 107 may include a voltage suppression material 109 (not shown in FIGS. 1-6). As used herein, a "voltage suppression material" may be a material that reversibly acts as an electrical insulator until a threshold electric field is applied across the material, at which point the material acts as an electrical conductor. This threshold electric field may be referred to herein as the "trigger field," and the voltage at which the field is in the material is higher than the trigger field may be referred to herein as the "trigger voltage." The trigger voltage may depend on the thickness and other geometric properties of the voltage suppression material 109. Note that the reversible switching behavior of a voltage suppression material, from electrical insulator to electrical conductor and back, may deviate from an "ideal" voltage-controlled switch, as understood in the art. For example, the change in operation from an electrical insulator to an electrical conductor may not occur instantaneously at the trigger voltage, but instead, the trigger voltage may represent a voltage at which the resistance of the material decreases substantially from a nominal value. In some embodiments, the trigger voltage of an ESDP structure 107 including a voltage suppression material 109 may be between 2 volts and 10 volts.

In some embodiments, the voltage suppression material 109 may be a polymer voltage suppression material. A polymer voltage suppression material 109 may include a polymer with one or more conductive filler particles; when the trigger voltage is reached, the arrangement of the polymer matrix and the filler particles may substantially decrease the electrical resistance of the voltage suppression material 109. The material composition of a polymer voltage suppression material 109 may be selected to achieve a desired trigger voltage. In other embodiments, other voltage suppression materials 109 may be used in an ESDP structure 107. FIGS. 13-30 illustrate a variety of ESDP structures 107, including a voltage suppression material 109, that may be included in any of the IC structures 100 and/or IC package supports 168 (discussed below) disclosed herein.

Returning to FIG. 1, the IC structure 100 may include a surface dielectric material 116 (e.g., polyimide or similar material) and one or more conductive contacts 115 on the RDLs 108. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). In FIG. 1, the conductive contacts 115 are illustrated as taking the form of bond pads. The conductive contacts 115 may be electrically coupled with the electrical pathways 112 of the RDLs 108 and may route the electrical signals of the device layer 106 and/or other electrical signals (e.g., electrical signals received at the conductive contacts 126) to other external devices. For example, solder 118 may be deposited on the one or more conductive contacts 115 to mechanically and/or electrically couple the IC structure 100 with another component at the front face 142 (e.g., another chip). The IC structure 100 may include additional or alternate structures to route the electrical signals to/from the RDLs 108; for example, the conductive contacts 115 may include other analogous features (e.g., posts) that route the electrical signals to/from external components. In some embodiments, the surface dielectric material 116 may be photodefinable (and thus may be directly patterned).

In some embodiments, the IC structure 100 may include one or more conductive contacts 126 on the back face 144 of the IC structure 100. In some embodiments, a surface dielectric material (not shown) may also be present. In FIG. 1, the conductive contacts 126 are illustrated as taking the form of pillars (e.g., copper pillars). The conductive contacts 126 may be electrically coupled with the electrical pathways 124 of the backside interconnect layers 120-2 (when the backside interconnect layers 120-2 are present) or the TSVs 104 (when the backside interconnect layers 120-2 are not present) and may route the electrical signals of the device layer 106 and/or other electrical signals (e.g., electrical signals received at the conductive contacts 115) to other external devices. For example, solder bumps 118 may be formed on the one or more conductive contacts 126 to mechanically and/or electrically couple the IC structure 100 with another component at the back face 144 (e.g., another chip). The IC structure 100 may include additional or alternate structures to route the electrical signals to/from the back face 144; for example, the conductive contacts 126 may include other analogous features (e.g., bond pads) that route the electrical signals to/from external components.

As noted above, FIGS. 2-6 illustrate other example embodiments of the IC structure 100. In FIG. 2, the IC structure 100 includes many of the features of the IC structure 100 of FIG. 1, but does not include TSVs 104, backside interconnect layers 120-2, or backside conductive contacts 126. The IC structure 100 of FIG. 2 may thus be a "single-sided" structure (i.e., with conductive contacts at only one face of the IC structure 100), while the IC structure 100 of FIG. 1 may be a "double-sided" structure (i.e., with conductive contacts at opposing faces of the IC structure 100).

In the IC structures 100 of FIGS. 3-5, no device layer 106 may be present. For example, in FIG. 3, the IC structure 100 includes backside conductive contacts 126 that are in electrical contact with the TSVs 104, which are in electrical contact with the electrical pathways 124 of frontside interconnect layers 120. Some of the electrical pathways 124 may also be in electrical contact with the electrical pathways 112 of the RDLs 108. The IC structure 100 of FIG. 4 is similar to that of FIG. 3, but does not include interconnect layers 120; the backside conductive contacts 126 are in electrical contact with the TSVs 104, which are in electrical contact with the electrical pathways 112 of the RDLs 108.

The structure 100 of FIG. 5 is similar to that of FIG. 4, but does not include any TSVs 104 and does include a barrier material 136 between the substrate 102 and the RDLs 108. The barrier material 136 may be selected to limit diffusion between the substrate 102 and the dielectric material 110; for example, when the substrate 102 includes silicon, the barrier material 136 may include silicon nitride. An IC structure 100 like that of FIG. 4 may be particularly advantageous as an interposer (e.g., an embedded interposer in an organic package substrate) between different dies or other electronic components coupled to the front face 142.

Figure 6:
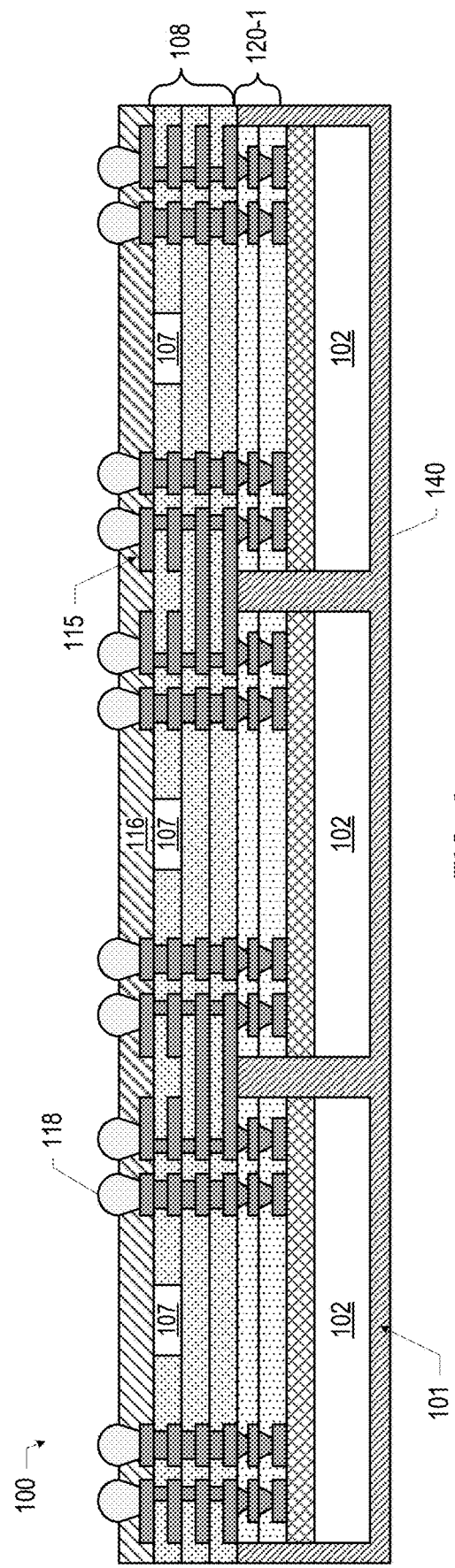

FIG. 6 illustrates a "reconstituted die" embodiment of the IC structure 100. In particular, FIG. 6 illustrates multiple dies 101 electrically coupled by a set of RDLs 108 that span the multiple dies 101. A dielectric material 140 (e.g., a mold compound, silicon dioxide, spin-on glass, etc.) may be disposed laterally around the dies 101, allowing the IC structure 100 of FIG. 6 to be handled and managed as if it were a single "die."

The ESDP structures 107 disclosed herein may be included in an IC package support 168, instead of or in addition to being included in an IC structure 100. As used herein, an "IC package support" may refer to a component of an IC package that provides mechanical and/or electrical support to other IC devices in the IC package. Examples of IC package supports 168 may include package substrates, interposers, and/or bridges, examples of which are discussed below with reference to FIGS. 8-12.

Figure 7:
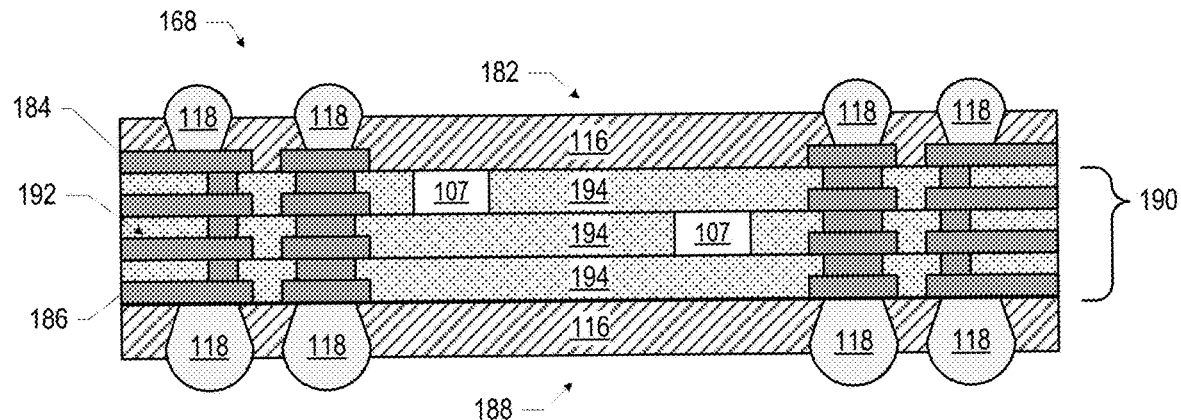
FIG. 7 is a side, cross-sectional view of an example IC package support including ESDP structures, in accordance with various embodiments.

FIG. 7 is a side, cross-sectional view of an example IC package support 168 including one or more ESDP structures 107. The IC package support 168 may include interconnect layers 190 including a dielectric material 194 and electrical pathways 192 through the dielectric material 194; the electrical pathways 192 may include conductive lines and/or vias embedded in the dielectric material 194, and vias may electrically couple lines in different ones of the interconnect layers 190, as discussed above with reference to the RDLs 108. In some embodiments, the dielectric material 194 may be an organic dielectric material; examples of organic dielectric materials may include organic build-up films, or glass-reinforced epoxy laminate material (e.g., a woven fiberglass cloth with an epoxy resin binder). Although a particular number of interconnect layers 190 (i.e., three) is depicted in FIG. 7, an IC package support 168 may include any desired number of interconnect layers 190. In some embodiments, an IC package support 168 may be manufactured using conventional printed circuit board (PCB) techniques. In some embodiments, some or all of the vias and/or lines included in the electrical pathways 192 may be manufactured using a lithographic via technique; for example, a lithographic via techniques may be used to form some of the elements of the ESDP structures 107 discussed below with reference to FIGS. 13-30.

An IC package support 168 may include a surface dielectric material 116 (e.g., polyimide or similar material) and one or more conductive contacts 184 and 186 at opposing faces 182 and 188, respectively. In some embodiments, the conductive contacts 184 may be FLIs, and the conductive contacts 186 may be second-level interconnects (SLIs). The conductive contacts 184 and 186 may be electrically coupled with the electrical pathways 192 and may route electrical signals accordingly. In some embodiments, solder 118 may be deposited on the one or more conductive contacts 184 and 186 to mechanically and/or electrically couple the IC package support 168 with other components (e.g., IC structures 100, circuit boards, etc.).

One or more IC structures 100, and/or one or more IC package supports 168, may be included in an IC assembly 150. FIGS. 8-12 illustrate various examples of IC assemblies 150 including ESDP structures 107, but these particular examples are not exhaustive, and any of the IC structures 100 and/or the IC package supports 168 disclosed herein may be combined with any other suitable components in any other suitable manner to form an IC assembly 150. Although FIGS. 8-12 depict ESDP structures 107 in each element of the IC assemblies 150, this is simply an example, and ESDP structures 107 may be included in some but not all elements of the IC assembly 150. For example, in some embodiments, ESDP structures 107 may be included in the IC structure 100-2 of the IC assembly 150 of FIG. 8, but not in the IC structure 100-1 (or vice versa). In another example, in some embodiments, ESDP structures 107 may be included in the IC package support 168 of the IC assembly 150 of FIG. 9, but not in the IC structure 100 (or vice versa). Further, any of the IC assemblies 150 of any of FIGS. 8-12 may be combined as desired to form further IC assemblies 150.

Figures 8, 9:
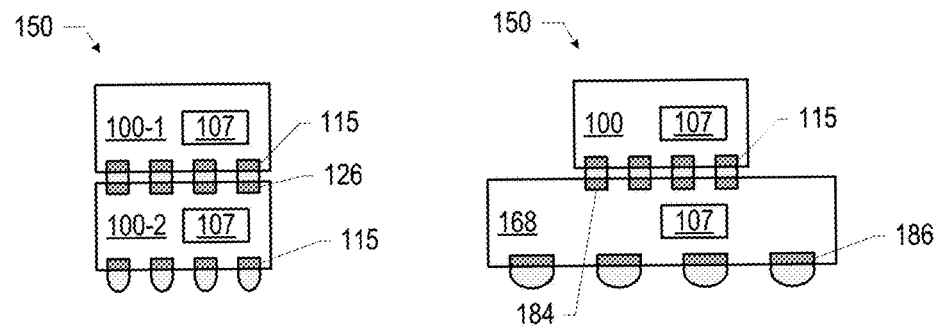
FIGS. 8-12 are side, cross-sectional views of example IC assemblies including ESDP structures, in accordance with various embodiments.

FIG. 8 illustrates an IC assembly 150 including a single-sided IC structure 100-1 coupled to a double-sided IC structure 100-2 (e.g., by solder). In some embodiments, the IC structure 100-1 of FIG. 8 may be the IC structures 100 of FIG. 2, 5, or 6, and the IC structure 100-2 of FIG. 8 may be the IC structures 100 of FIG. 1, 3, or 4. As noted above, in some embodiments, the IC structure 100-1 may include ESDP structures 107 while the IC structure 100-2 does not include ESDP structures 107 (or vice versa). In some embodiments, the IC structure 100-2 may be referred to as an "interposer"; if the IC structure 100-2 includes a device layer 106 (or otherwise includes active devices, such as transistors), the IC structure 100-2 may be referred to as an "active interposer," and if the IC structure 100-2 does not include a device layer 106 (or otherwise does not include active devices), the IC structure 100-2 may be referred to as a "passive interposer." In some embodiments, an IC structure 100 that does not include any ESDP structures 107 may instead include diodes for ESDP purposes, or may not include such diodes. Although FIG. 8 illustrates a single IC structure 100-1 coupled to the IC structure 100-2, multiple IC structures 100-1 may be coupled to the IC structure 100-2, as desired.

FIG. 9 illustrates an IC assembly 150 including a single-sided IC structure 100 coupled to an IC package support 168 (e.g., by solder). In some embodiments, the IC structure 100 of FIG. 9 may be the IC structures 100 of FIG. 2, 5, or 6; in other embodiments, the IC structure 100 of the IC assembly 150 of FIG. 9 may be a double-sided IC structure 100-1 (e.g., the IC structure 100 of FIG. 1, 3, or 4) and further IC structures (not shown) may be coupled "on top" of the IC structure 100. As noted above, in some embodiments, the IC structure 100 may include ESDP structures 107 while the IC package support 168 does not include ESDP structures 107 (or vice versa). In some embodiments, the IC package support 168 of FIG. 9 may be referred to as a "package substrate," and the IC assembly 150 may be referred to as an "IC package" and may in turn be coupled to a circuit board or other component. In some embodiments, the IC package support 168 of FIG. 9 may be an interposer between the IC structure 100 and another component (e.g., an IC structure 100 or an IC package support 168). Although FIG. 9 illustrates a single IC structure 100 coupled to the IC package support 168, multiple IC structures 100 may be coupled to the IC package support 168, as desired.

Figure 10:
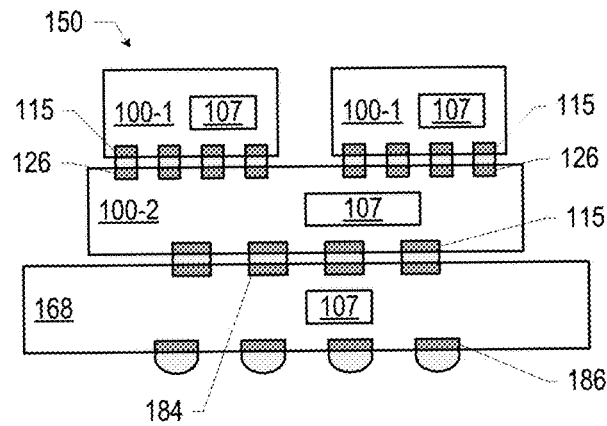

FIG. 10 illustrates an IC assembly 150 including single-sided IC structures 100-1 coupled to a double-sided IC structure 100-2 (e.g., by solder). The double-sided IC structure 100-2 is also coupled to an IC package support 168 (e.g., by solder). In some embodiments, the IC structures 100-1 of FIG. 10 may be the IC structures 100 of FIG. 2, 5, or 6; in other embodiments, the IC structures 100-1 of the IC assembly 150 of FIG. 10 may be double-sided IC structures 100-1 (e.g., the IC structure 100 of FIG. 1, 3, or 4) and further IC structures (not shown) may be coupled "on top" of the IC structures 100-1. In some embodiments, the IC structure 100-2 may be the IC structures 100 of FIG. 1, 3, or 4. As noted above, in some embodiments, one or more of the IC structures 100 may include ESDP structures 107 while the IC package support 168 does not include ESDP structures 107 (or vice versa). In some embodiments, the IC structure 100-2 of FIG. 10 may be referred to as an interposer (e.g., as discussed above with reference to FIG. 8), while the IC package support 168 may be referred to as a package substrate. In some embodiments, the IC assembly 150 may include an IC package support 168 in the place of the IC structure 100-2, instead of the IC structure 100-2.

Figure 11:
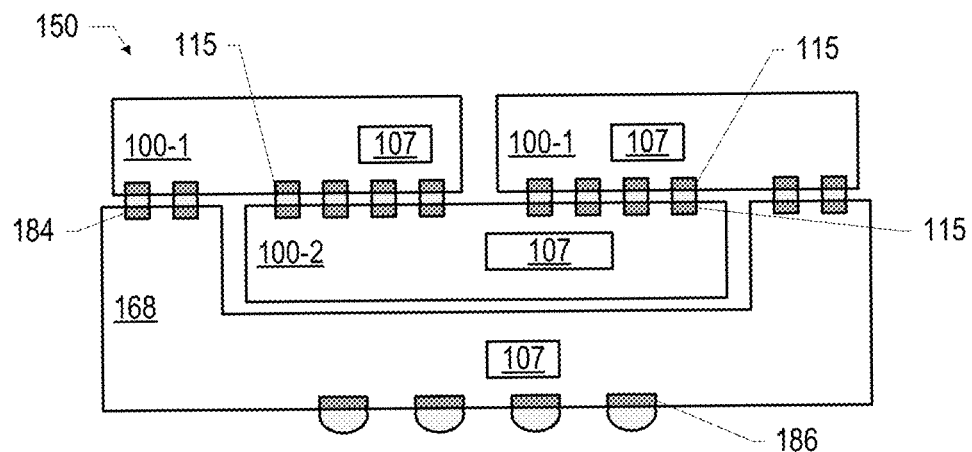

FIG. 11 illustrates an IC assembly 150 including single-sided IC structures 100-1 coupled to another single-sided IC structure 100-1 (e.g., by solder) and also to an IC package support 168 (e.g., by solder). In the IC assembly 150 of FIG. 11, the IC structure 100-2 may be referred to as a "bridge" (e.g., an "embedded bridge" due to the disposition of the IC structure 100-2 in a cavity of the IC package support 168). In some embodiments, the IC structures 100 of FIG. 11 may be the IC structures 100 of FIG. 2, 5, or 6. As noted above, in some embodiments, one or more of the IC structures 100 may include ESDP structures 107 while the IC package support 168 does not include ESDP structures 107 (or vice versa).

Figure 12:
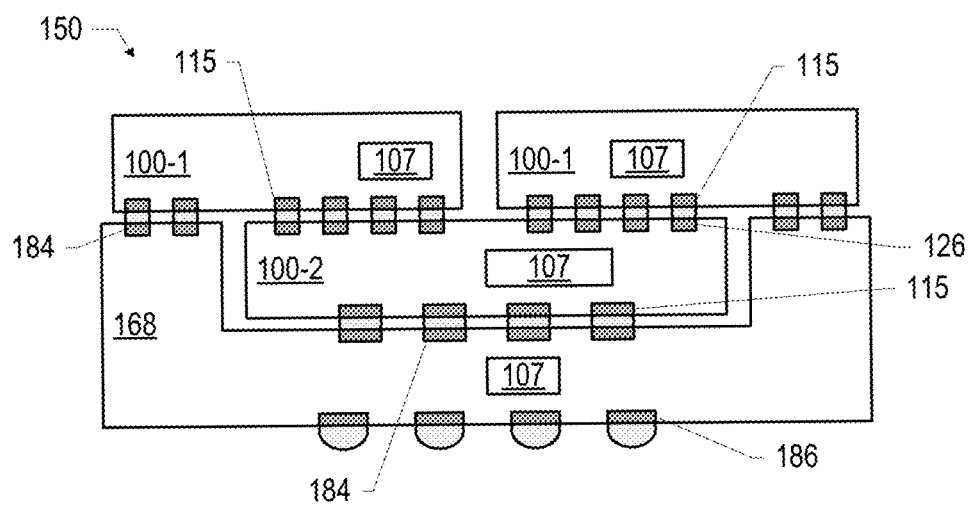

FIG. 12 illustrates an IC assembly 150 similar to the IC assembly 150 of FIG. 11 but in which the IC structure 100-2 is a double-sided IC structure (e.g., the IC structure 100 of FIG. 1, 3, or 4) and is also coupled to the IC package support 168 (e.g., by solder). In such an arrangement, the IC structure 100-2 may be a double-sided bridge.

Figure 13:
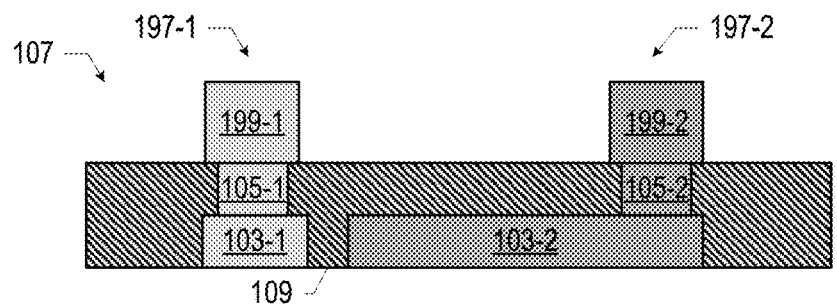
FIGS. 13-30 illustrate example ESDP structures, in accordance with various embodiments.

FIGS. 13-30 illustrate example ESDP structures 107 including voltage suppression material 109, in accordance with various embodiments. The ESDP structures 107 of FIGS. 13-30 may be included in any of the IC structures 100 (e.g., in the RDLs 108) or in the IC package supports 168 disclosed herein. Any of the features discussed with reference to any of FIGS. 13-30 may be combined with any other features to form a ESDP structure 107. For example, as discussed further below, FIG. 13 illustrates an embodiment in which a layer of voltage suppression material 109 surrounds the conductive lines 103 and conductive vias 105 in an interconnect layer, and FIG. 19 illustrates an embodiment in which a conductive line 103-2 surrounds a conductive line 103-1. These features of FIGS. 13 and 19 may be combined so that an ESDP structure 107 has a layer of voltage suppression material 109 that surrounds the conductive lines 103 and conductive vias 105 in an interconnect layer, and in which a conductive line 103-2 surrounds a conductive line 103-1. This particular combination is simply an example, and any combination may be used.

The ESDP structures 107 of FIGS. 13-30 are discussed with reference to conductive structures 197; when the ESDP structure 107 is included in an IC structure 100, the conductive structures 197 may be parts of electrical pathways 112, and when the ESDP structure 107 is included in an IC package support 168, the conductive structures 197 may be parts of electrical pathways 192. The conductive structures 197 may include conductive contacts 199; when the ESDP structure 107 is included in an IC structure 100, the conductive contacts 199 may be the conductive contacts 115, and when the ESDP structure 107 is included in an IC package support 168, the conductive contacts 199 may be the conductive contacts 184 or the conductive contacts 186. Further, the particular conductive structures 197 depicted in FIGS. 13-30 are simply illustrative, and conductive structures 197 that are part of an ESDP structure 107 may have any suitable form. The ESDP structures 107 of FIGS. 13-30 are also discussed with reference to a dielectric material 198; when the ESDP structure 107 is included in an IC structure 100, the dielectric material 198 may be the dielectric material 110, and when the ESDP structure 107 is included in an IC package support 168, the dielectric material 198 may be the dielectric material 194.

Figure 14:
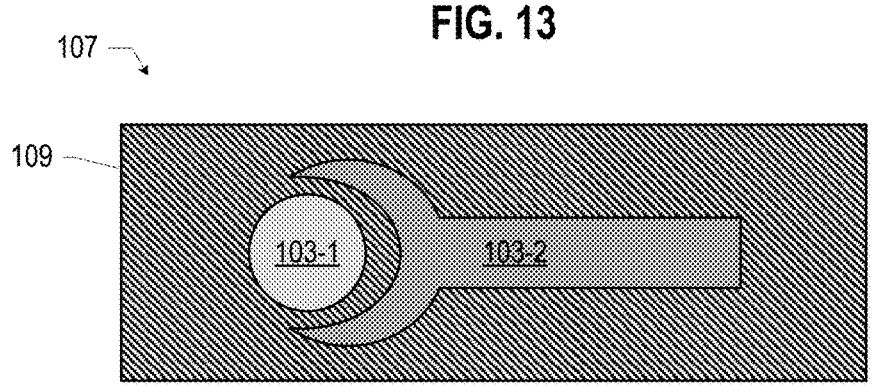

FIG. 13 is a side, cross-sectional view of an example ESDP structure 107, while FIG. 14 is a top, cross-sectional view of the same ESDP structure 107. The ESDP structure 107 of FIGS. 13-14 includes a conductive structure 197-1 including a conductive contact 199-1, a conductive via 105-1, and a conductive line 103-1 (e.g., a conductive pad). The ESDP structure 107 of FIGS. 13-14 also includes a conductive structure 197-2 including a conductive contact 199-2, a via 105-2, and a conductive line 103-2. In the ESDP structure 107 of FIGS. 13-14 (and in FIGS. 15-30), one of the conductive structures 197 (i.e., the conductive structure 197-1 or the conductive structure 197-2) is to operate as a ground pathway while the other of the conductive structures 197 is to operate as a signal pathway. For ease of discussion, the conductive structures 197-1 may be referred to as "ground" while the conductive structures 197-2 may be referred to as "signal," but the roles of these conductive structures 197 may be reversed as desired.

In the ESDP structure 107 of FIGS. 13-14, the conductive lines 103 of the conductive structures 197 are coplanar (e.g., may be included in a same interconnect layer). As shown, a voltage suppression material 109 may surround the conductive lines 103 and conductive vias 105 of the conductive structures 197. In such an embodiment, the voltage suppression material 109 may take the place of a layer of dielectric material in which the lines 103 and conductive vias 105 would be disposed. As illustrated in FIG. 14, the conductive line 103-2 may be patterned so as to partially surround the conductive line 103-1, with the voltage suppression material 109 at least partially between the conductive line 103-1 and the conductive line 103-2. During operation of the component including the ESDP structure 107 of FIGS. 13-14, if the voltage between the signal conductive structure 197-2 and the ground conductive structure 197-1 exceeds the trigger voltage of the voltage suppression material 109, the voltage suppression material 109 may begin to act as a conductor, shorting the signal conductive structure 197-2 to the ground conductive structure 197-1 via the voltage suppression material 109.

Figure 15:
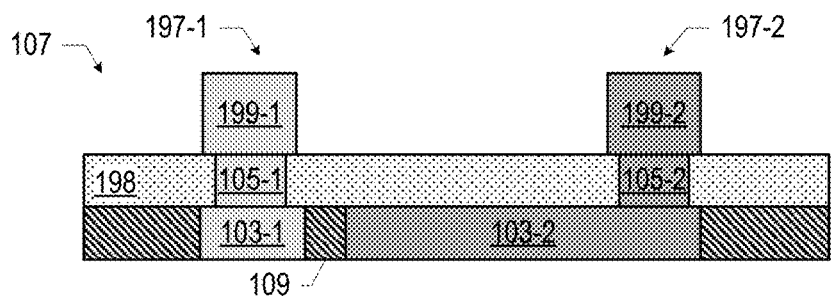
Figure 16:
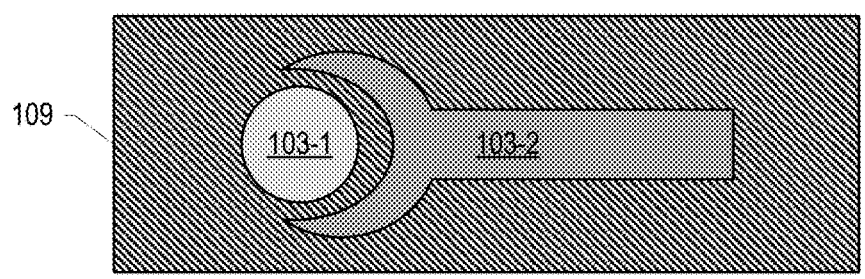

FIGS. 15 and 16 are side and top cross-sectional views, respectively, of another example ESDP structure 107. The ESDP structure 107 of FIGS. 15-16 is similar to that of FIGS. 13-14, but the location of the voltage suppression material 109 in the embodiment of FIGS. 15-16 is restricted to the plane of the conductive lines 103 and thus the voltage suppression material 109 does not laterally surround the conductive vias 105, for example. Instead, another dielectric material 198 may be disposed above the conductive lines 103 and the voltage suppression material 109, and may laterally surround the conductive vias 105. The embodiment of FIGS. 15-16 may require less voltage suppression material 109 than the embodiment of FIGS. 13-14, but may require two separate deposition operations (i.e., the deposition of the voltage suppression material 109 and the deposition of the dielectric material 198).

Figure 17:
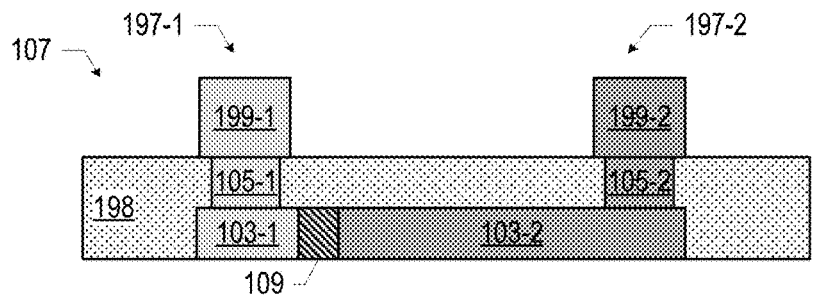
Figure 18:
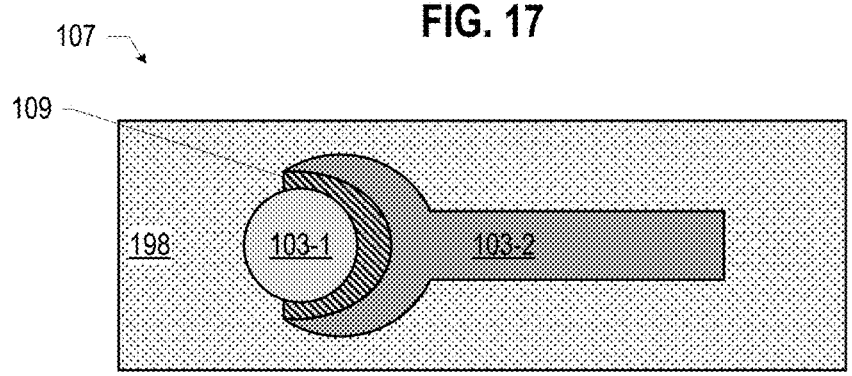
Figure 19:
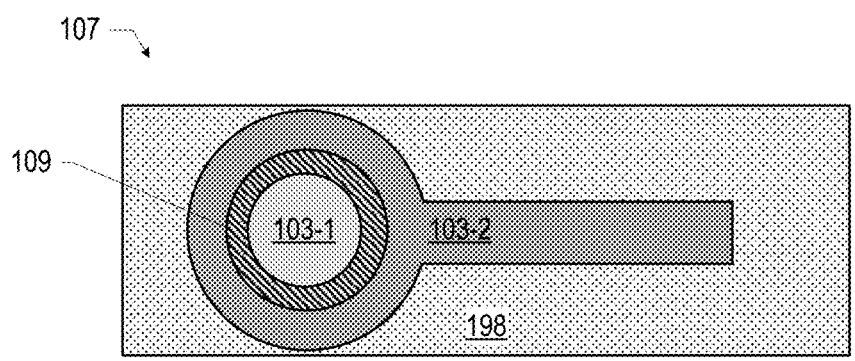

FIGS. 17 and 18 are side and top cross-sectional views, respectively, of another example ESDP structure 107. The ESDP structure 107 of FIGS. 17-18 is similar to that of FIGS. 13-14 and 15-16, but the location of the voltage suppression material 109 in the embodiment of FIGS. 17-18 is restricted to a particular region between the conductive lines 103 of the conductive structures 197-1 and 197-2, as shown. The embodiment of FIGS. 17-18 may require less voltage suppression material 109 in the embodiment of FIGS. 15-16, but may require a more complex patterning of the voltage suppression material 109 than the embodiments of FIGS. 13-14 and FIGS. 15-16.

In the embodiments of FIGS. 13-18, a portion of the conductive structure 197-2 is shown as partially surrounding a portion of the conductive structure 197-1. In other embodiments, a portion of the conductive structure 197-2 may entirely surround a portion of the conductive structure 197-1. For example, FIG. 19 is a top, cross-sectional view of an ESDP structure 107 in which the conductive line 103-2 of a conductive structure 197-2 is patterned so as to surround the conductive line 103-one of the conductive structure 197-1. In the embodiment of FIG. 19, the voltage suppression material 109 may be restricted to the area between the conductive lines 103-1 and 103-2, but this is simply illustrative.

Figure 20:
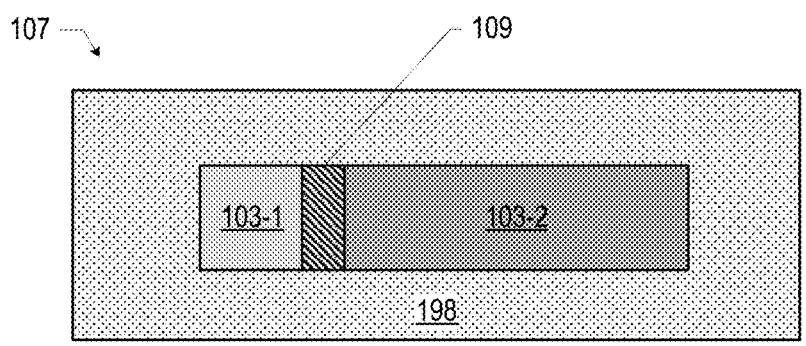

In the embodiments of FIGS. 13-19, the conductive line 103-1 has been shown as having a circular footprint, but the conductive line 103-1 may have any suitable footprint. For example, FIG. 20 is a top, cross-sectional view of an ESDP structure 107 in which the conductive line 103-1 has a rectangular footprint, with a substantially straight face facing a similarly straight face of the conductive line 103-2. In the embodiment of FIG. 20, the voltage suppression material 109 may be restricted to the area between these faces, but this is simply illustrative. In some other embodiments, not shown, the voltage suppression material 109 may be disposed at the surface of an IC structure 100 or IC package support 168, in direct contact with a ground conductive contact 199-1 and a signal conductive contact 199-2; such an embodiment may be useful in settings where the conductive contacts 199 are spaced apart at a fine enough pitch to permit triggering the voltage suppression material 109 at the desired voltage.

Figure 21:
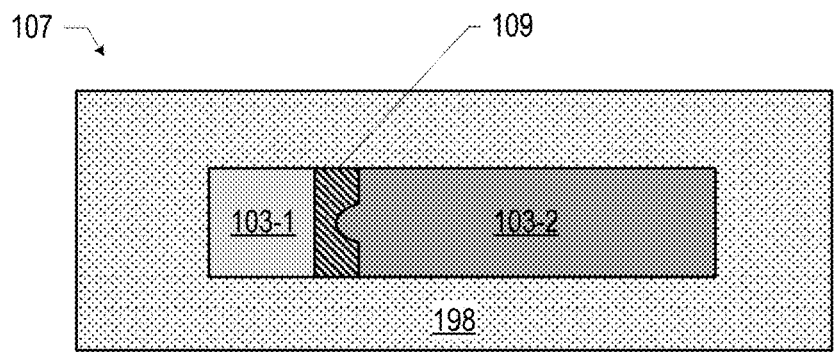

In some embodiments, the distance between the conductive structure 197-1 and the conductive structure 197-2 may be less in a region of the voltage suppression material 109 than outside a region of the voltage suppression material 109. Such a "narrowing" may allow a localized increase in the electric field during operation, reducing the trigger voltage relative to embodiments in which no such narrowing is present, and may also reduce any parasitic capacitance arising from the use of the voltage suppression material 109 (and thereby reduce potential disruptions to high frequency signals). For example, FIG. 21 is a top, cross-sectional view of an ESDP structure 107 in which the conductive line 103-2 includes a protrusion that extends toward the conductive line 103-1 in the region of the voltage suppression material 109. The protrusion may result in a narrowing of the distance between the conductive structures 197 to achieve desired trigger behavior of the ESDP 107. Although the protrusion has a particular shape in FIG. 20, this is simply illustrative, and any suitable shape may be used.

Figure 22:
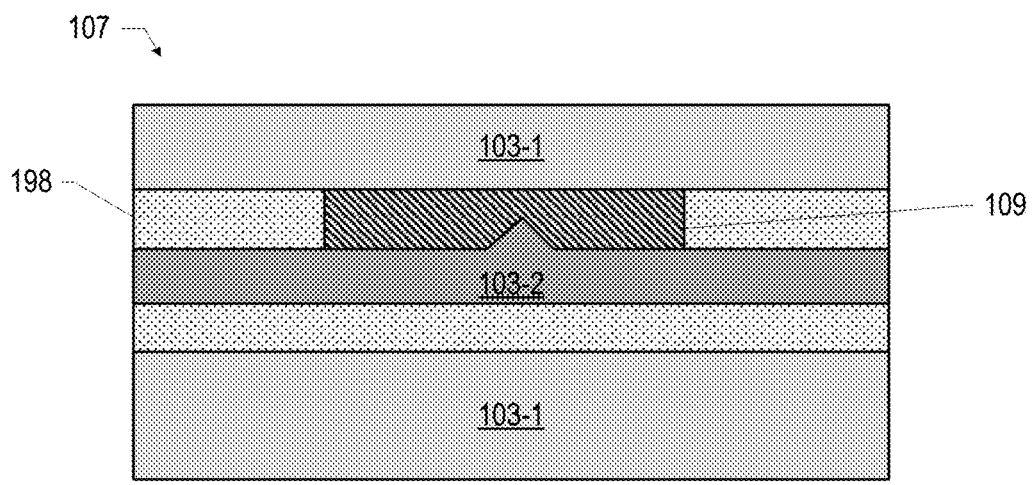
Figure 23:
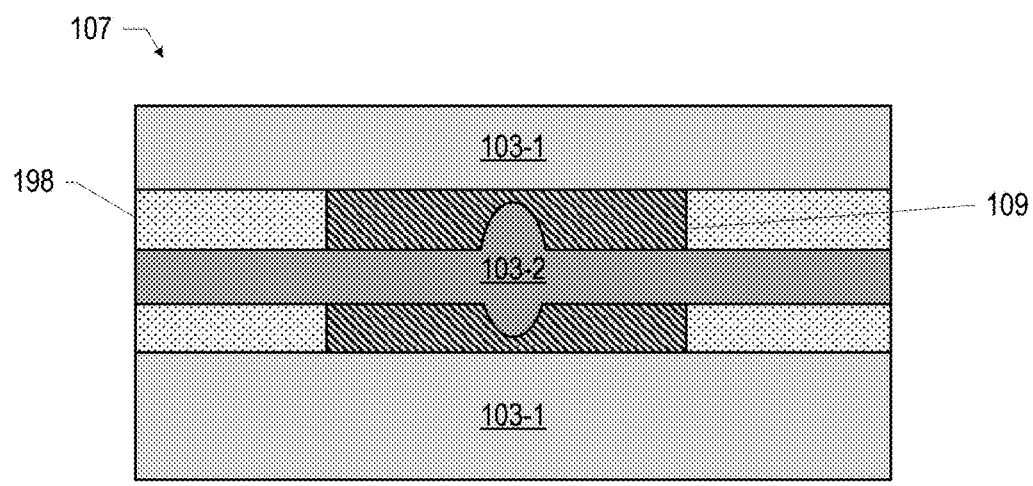

In some embodiments, a signal pathway may be located proximate to one ground pathway (e.g., a microstrip line) or between two ground pathways (e.g., in a coplanar waveguide or dual coplanar waveguide arrangement). In such embodiments, voltage suppression material 109 may be located between the signal pathway and one of the ground pathways, or between the signal pathway and both of the ground pathways. For example, FIG. 22 is a top, cross-sectional view of an ESDP structure 107 having voltage suppression material 109 between a signal conductive line 103-2 (part of a signal conductive structure 197-2) and a parallel ground conductive line 103-1 (part of a ground conductive structure 197-1). No voltage suppression material 109 may be present between the signal conductive line 103-2 and another parallel ground conductive line 103-1 (part of a ground conductive structure 197-1), as shown. Protrusions or other geometric arrangements that selectively narrow the distance between conductive structures 197 in a region of the voltage suppression material 109 may also be used, as shown. For example, FIG. 23 is a top, cross-sectional view of an ESDP structure 107 having voltage suppression material 109 between a signal conductive line 103-2 (part of a signal conductive structure 197-2) and both parallel ground conductive lines 103-1 (part of a ground conductive structure 197-1). Further, the signal conductive line 103-2 may include protrusions toward both of the ground conductive lines 103-1 in the regions of the voltage suppression material 109 (e.g., to achieve desired trigger behavior or to support higher protection current).

Figure 24:
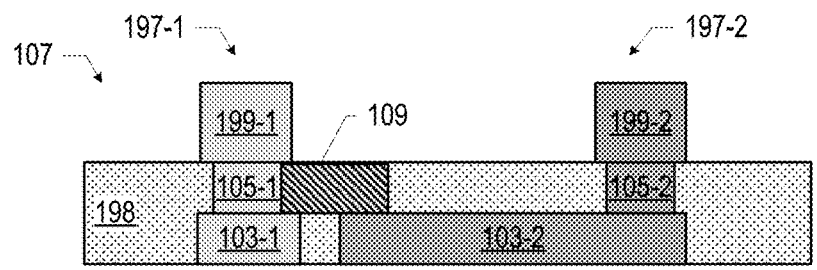

In the embodiments of FIGS. 13-22, the conductive lines 103 and the voltage suppression material 109 have been at least partially coplanar. In other embodiments, the conductive lines 103 and the voltage suppression material 109 may not be coplanar. For example, FIG. 24 is a side, cross-sectional view of an ESDP structure 107 in which the conductive lines 103-1 and 103-2 are coplanar, but the voltage suppression material 109 is not coplanar with the conductive lines 103-1 and 103-2 (and instead contacts the conductive lines 103 at their "top" surfaces). Any suitable arrangement in which the voltage suppression material 109 is in contact with the conductive structures 197-1 and 197-2 may be used.

Figure 25:
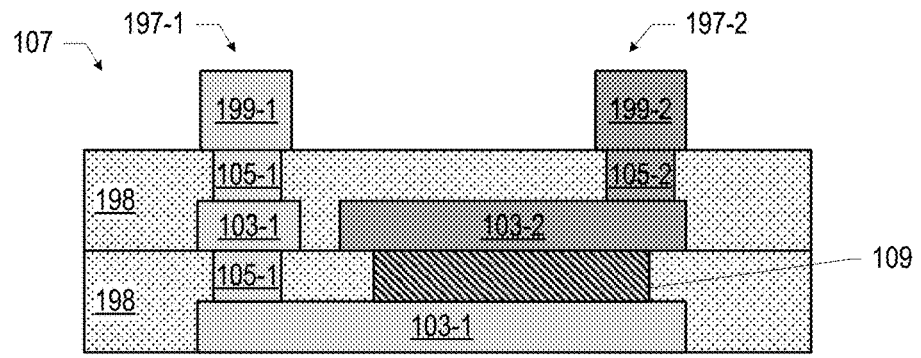

In the embodiments of FIGS. 13-23, the conductive lines 103-1 and 103-2 of the conductive structures 197-1 and 197-2, respectively, have been coplanar. In other embodiments, the conductive lines 103-1 and 103-2 of the conductive structures 197-1 and 197-2, respectively, may not be coplanar. For example, FIG. 25 is a side, cross-sectional view of an ESDP structure 107 in which the conductive line 103-1 of the conductive structure 197-1 is non-coplanar (e.g., in a different interconnect layer) with the conductive line 103-2 of the conductive structure 197-2. The voltage suppression material 109 may be in contact with the conductive lines 103-2 and 103-1, as shown.

Figure 26:
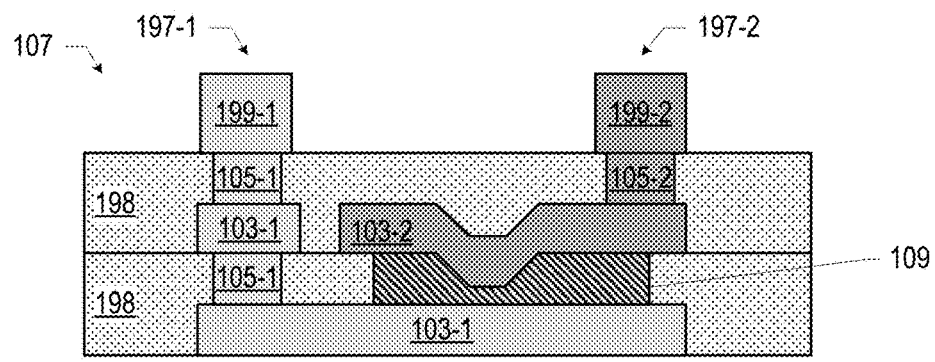
Figure 27:
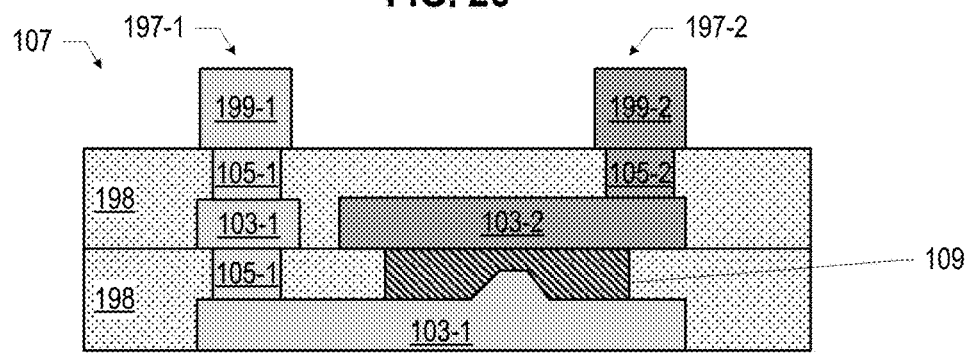

Just as a conductive structure 197 may include one or more protrusions in a region of the voltage suppression material 109 to narrow the distance to another conductive structure 197 when the conductive structures 197 are coplanar (e.g., in a same interconnect layer), one or more conductive structures 197 may include such protrusions when the conductive structures 197 are non-coplanar (e.g., in different interconnect layers). For example, FIG. 26 is a side, cross-sectional view of an ESDP structure 107 in which the conductive line 103-2 includes a bend that provides a protrusion that extends toward the conductive line 103-1 in the region of the voltage suppression material 109. The protrusion may result in a narrowing of the distance between the conductive structures 197 to achieve desired trigger behavior of the ESDP 107. Although the protrusion has a particular shape in FIG. 26, this is simply illustrative, and any suitable shape may be used. For example, FIG. 27 is a side, cross-sectional view of an ESDP structure 107 in which the conductive line 103-1 includes a protrusion that extends toward the conductive line 103-2 in the region of the voltage suppression material 109. Any arrangement of protrusions or other geometric features in either or both of the conductive structures 197 in a region of the voltage suppression material 109 may be used.

Figure 28:
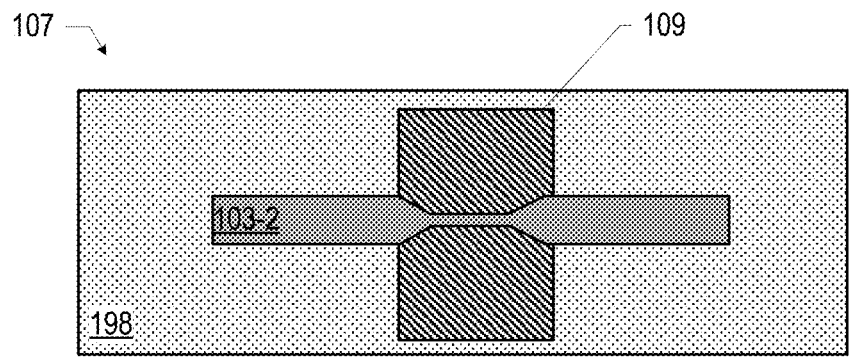

In some embodiments, a conductive structure 197 may be narrowed in a region of the voltage suppression material 109 to amplify the electric fields in the region and thus achieve desired trigger behavior. For example, FIG. 28 is a top view illustrating a narrowed portion of a conductive line 103-2 (part of a conductive structure 197-2) over a portion of the voltage suppression material 109. A conductive line 103-1 (not shown, part of a conductive structure 197-1) may be disposed under the voltage suppression material 109 so that the conductive lines 103-1 and 103-2 are non-coplanar. The embodiments of FIGS. 24-28 may be particularly advantageous in a microstrip line or stripline arrangement.

Figure 29:
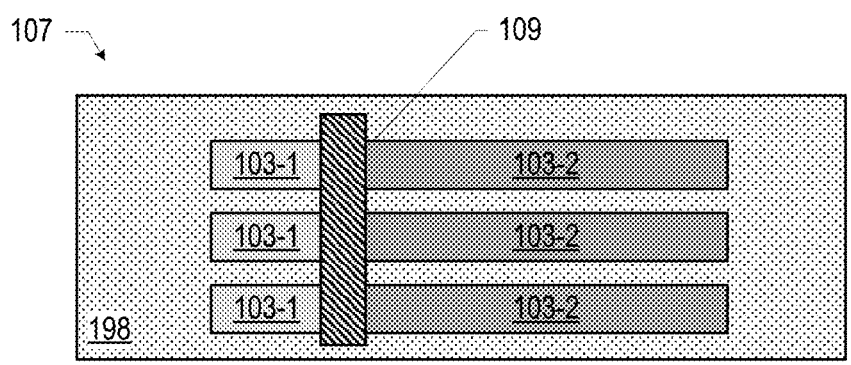
Figure 30:
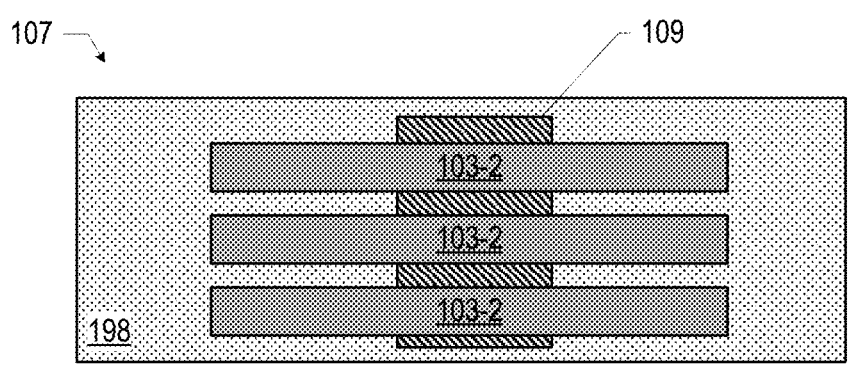

In some embodiments, a single continuous portion of voltage suppression material 109 may be used as part of multiple ESDP structures 107. For example, FIG. 29 is a top, cross-sectional view of three ESDP structures 107, each including a conductive line 103-1 (part of a conductive structure 197-1) and a conductive line 103-2 (part of a conductive structure 197-2) with voltage suppression material 109 therebetween. A single "trench" of voltage suppression material 109 may be part of each of the three ESDP structures 107. In some embodiments, the longitudinal axis of the trench of voltage suppression material 109 may be perpendicular to the conductive lines 103 of the ESDP structures 107. Similarly, FIG. 30 is a top view of three ESDP structures 107, each including a conductive line 103-2 (part of a conductive structure 197-2) over a "common" portion of voltage suppression material 109. Corresponding conductive lines 103-2 (not shown, part of a conductive structure 197-2) may be located under the voltage suppression material 109, as discussed above with reference to FIG. 28.

The ESDP structures 107 may be manufactured using any appropriate techniques. For example, FIGS. 31-35 illustrate stages in an example process of manufacturing the ESDP structure 107 of FIG. 13, in accordance with various embodiments. Although the operations of the process of FIGS. 31-35 are illustrated with reference to particular embodiments of the ESDP structures 107 disclosed herein, the process may be used to form any suitable ESDP structures 107. Operations are illustrated once each and in a particular order in FIGS. 31-35, but the operations may be reordered and/or repeated as desired (e.g., with different operations performed in parallel when manufacturing multiple electronic components simultaneously).

Figure 31:
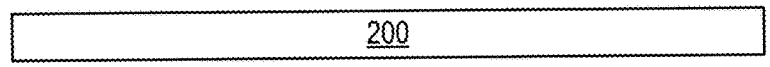
FIGS. 31-35 illustrate stages in an example process of manufacturing the ESDP structure of FIG. 13, in accordance with various embodiments.

FIG. 31 is a side, cross-sectional view of an assembly 202 including a base structure 200. The base structure 200 may be any structure on which the ESDP structure 107 is to be fabricated. For example, the base structure 200 may be a portion of an IC structure 100 or a portion of an IC package support 168.

Figure 32:
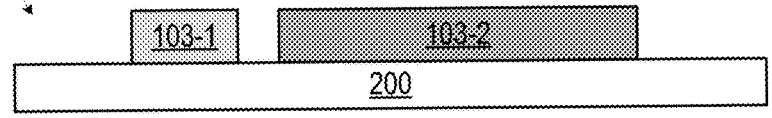

FIG. 32 is a side, cross-sectional view of an assembly 204 subsequent to forming conductive lines 103-1 and 103-2 on the base structure 200 of the assembly 202 (FIG. 31). The conductive lines 103-1 and 103-2 may be formed using any suitable technique, such as a lithography technique.

Figure 33:
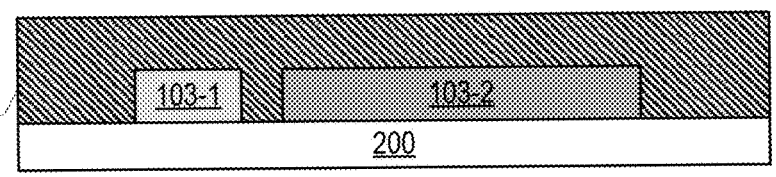

FIG. 33 is a side, cross-sectional view of an assembly 206 subsequent to depositing a voltage suppression material 109 on the conductive lines 103-1 and 103-2 of the assembly 204 (FIG. 32). The voltage suppression material 109 may be deposited using any suitable technique, such as lamination or spin coating. In embodiments in which the voltage suppression material 109 is to be confined to the plane of the conductive lines 103, a thinner layer of voltage suppression material 109 may be used or the voltage suppression material 109 may be deposited before the conductive lines 103 and then patterned to accommodate the conductive lines 103.

Figure 34:
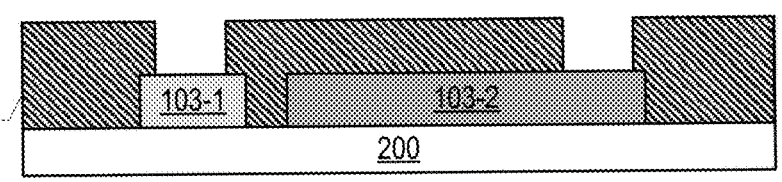

FIG. 34 is a side, cross-sectional view of an assembly 208 subsequent to forming openings in the voltage suppression material 109 of the assembly 206 (FIG. 33) to expose portions of the top surfaces of the conductive lines 103. As discussed below, these openings may correspond to the locations of conductive vias 105. In some embodiments, the openings may be formed by laser drilling or patterned etch. The operations of the assembly 208 may also include selectively removing portions of the voltage suppression material 109 in areas in which its presence is not required or desired, in some embodiments.

Figure 35:
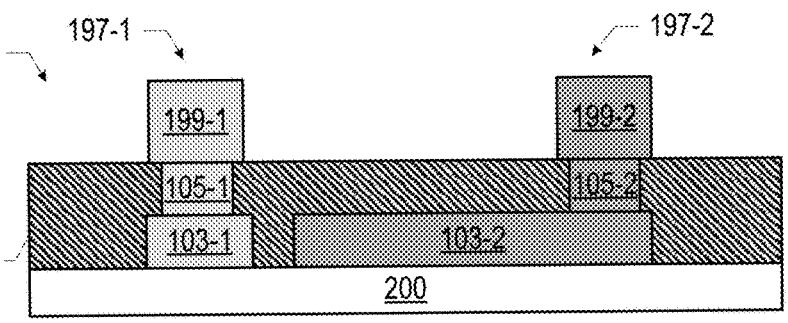

FIG. 35 is a side, cross-sectional view of an assembly 210 subsequent to forming conductive vias 105 in the openings of the assembly 208 (FIG. 34) and forming conductive contacts 199 in contact with the conductive vias 105. In some embodiments, the conductive vias 105 and conductive contacts 199 may be formed by an electroplating process. The resulting assembly 210 may take the form of the ESDP structure 107 of FIG. 13.

FIGS. 36-40 illustrate stages in an example process of manufacturing the ESDP structure 107 of FIG. 26, in accordance with various embodiments. Although the operations of the process of FIGS. 36-40 are illustrated with reference to particular embodiments of the ESDP structures 107 disclosed herein, the process may be used to form any suitable ESDP structures 107. Operations are illustrated once each and in a particular order in FIGS. 36-40, but the operations may be reordered and/or repeated as desired (e.g., with different operations performed in parallel when manufacturing multiple electronic components simultaneously).

Figure 36:
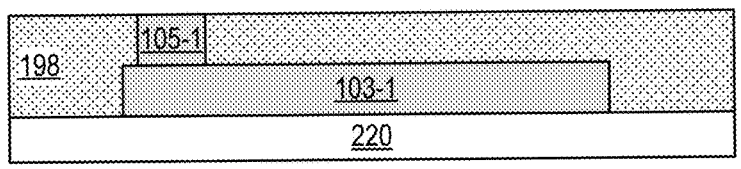
FIGS. 36-40 illustrate stages in an example process of manufacturing the ESDP structure of FIG. 26, in accordance with various embodiments.

FIG. 36 is a side, cross-sectional view of an assembly 222 including a base structure 220 on which a conductive line 103-1 and a conductive via 105-1 have been formed. The base structure 220 may be any structure on which the ESDP structure 107 is to be fabricated. For example, the base structure 220 may be a portion of an IC structure 100 or a portion of an IC package support 168. A dielectric material 198 (e.g., a single layer of dielectric material 198) may be disposed around the conductive line 103-1 and the conductive via 105-1.

Figure 37:
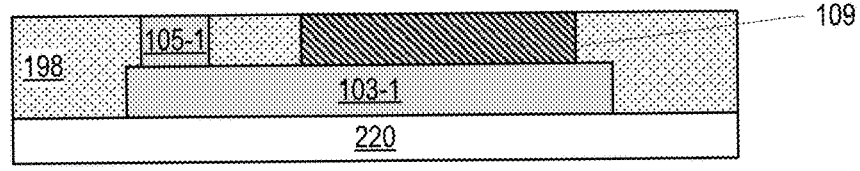

FIG. 37 is a side, cross-sectional view of an assembly 224 subsequent to removing a portion of the dielectric material 198 above the conductive line 103-1 in the assembly 222 (FIG. 36) and depositing voltage suppression material 109 in its place, in contact with the conductive line 103-1. As shown, the thickness of the voltage suppression material 109 in the assembly 224 may be the same as the height of the conductive via 105-1. In some embodiments, the dielectric material 198 may be removed by using a mask and reactive ion etching (RIE), by chemical ablation, by laser ablation, or any other suitable technique. In some embodiments, the voltage suppression material 109 may be deposited by stencil/screen printing and curing, or by a lamination and grinding technique.

Figure 38:
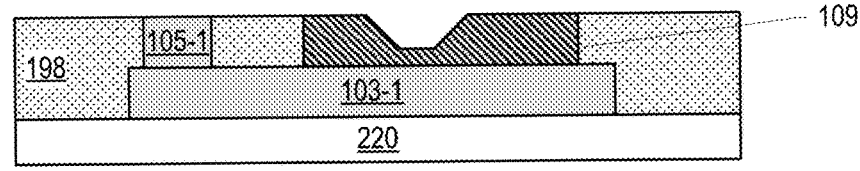

FIG. 38 is a side, cross-sectional view of an assembly 226 subsequent to forming a recess in the voltage suppression material 109 of the assembly 224 (FIG. 37). The recess may cause a portion of the voltage suppression material 109 to be thinned above the conductive line 103-1. In some embodiments, the recess in the voltage suppression material 109 may be formed by RIE or laser ablation.

Figure 39:
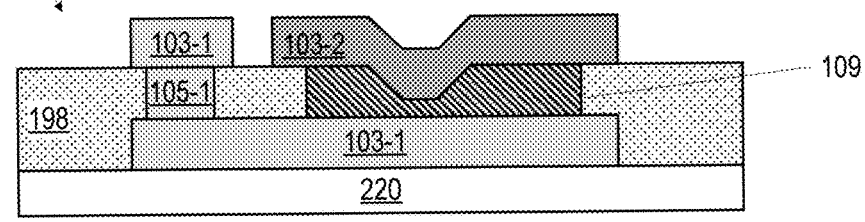

FIG. 39 is a side, cross-sectional view of an assembly 228 subsequent to forming further conductive lines 103-1 and 103-2 on the assembly 226 (FIG. 38). In some embodiments, conventional package processing techniques may be used to form the additional conductive lines 103, including deposition of a seed layer, deposition of a photoresist, exposure and development of the photoresist, electroplating of the conductive lines 103, then removal of the photoresist and seed layer.

Figure 40:
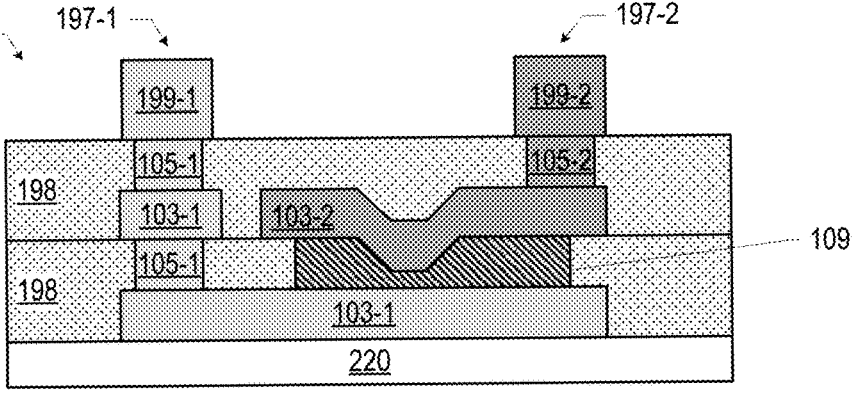

FIG. 40 is a side, cross-sectional view of an assembly 230 subsequent to depositing additional dielectric material 198 (e.g., another layer of dielectric material 198) on the assembly 228 (FIG. 39), and forming conductive vias 105-1 and 105-2 and conductive contacts 199-1 and 199-2 in contact with the conductive vias 105-1 and 105-2, respectively. The fabrication of the conductive vias 105 and the conductive contacts 199 of the assembly 230 may take the form of any of the embodiments discussed above with reference to FIGS. 34-35. The resulting assembly 230 may take the form of the ESDP structure 107 of FIG. 26.

Figure 41:
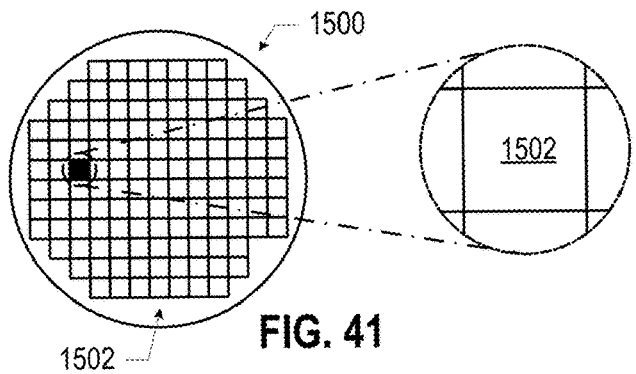
FIG. 41 is a top view of a wafer and dies that may include IC structures, in accordance with any of the embodiments disclosed herein.
Figure 42:
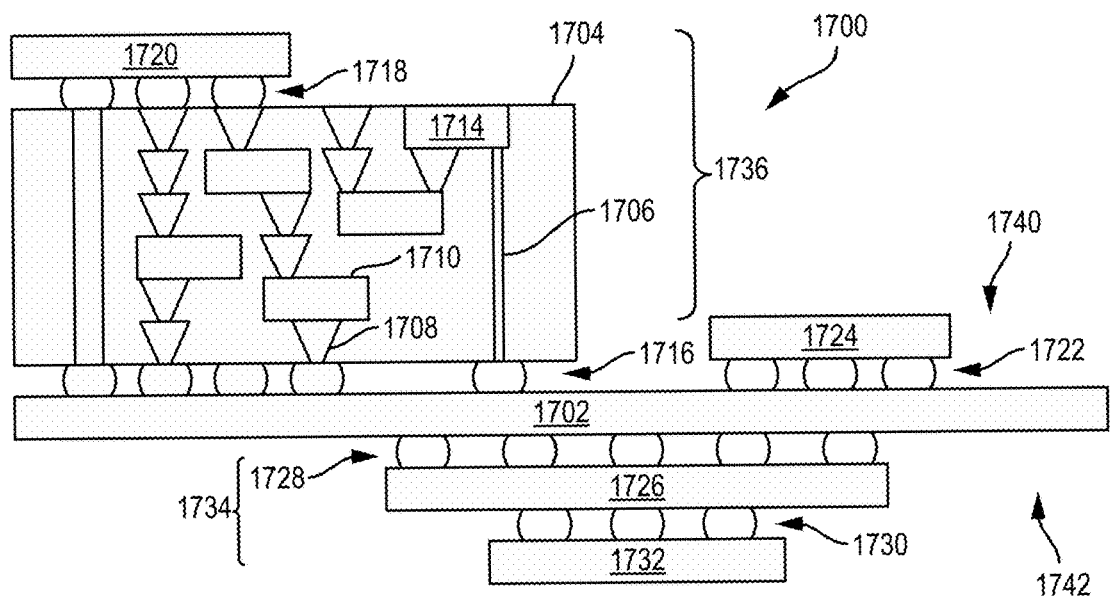
FIG. 42 is a side, cross-sectional view of an IC device assembly that may include IC structures, IC assemblies, IC package supports, and/or ESDP structures, in accordance with any of the embodiments disclosed herein.
Figure 43:
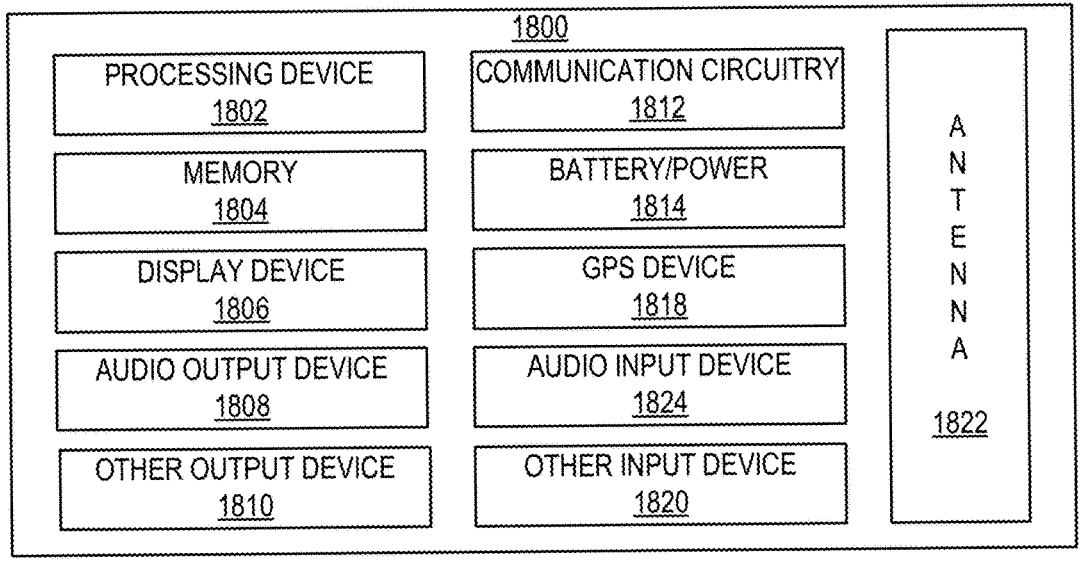
FIG. 43 is a block diagram of an example electrical device that may include IC structures, IC assemblies, IC package supports, and/or ESDP structures, in accordance with any of the embodiments disclosed herein.

The IC structures 100, IC assemblies 150, IC package supports 168, and/or ESDP structures 107 disclosed herein may include, or may be included in, any suitable electronic component. FIGS. 41-43 illustrate various examples of apparatuses that may include, or be included in, any of the IC structures 100, IC assemblies 150, IC package supports 168, and/or ESDP structures 107 disclosed herein, as appropriate.

FIG. 41 is a top view of a wafer 1500 and dies 1502 that may include one or more IC structures 100, or may be included in any suitable ones of the IC assemblies 150, IC package supports 168, and/or ESDP structures 107 disclosed herein. The wafer 1500 may be composed of a material (e.g., a semiconductor material) and may include one or more dies 1502 having structures formed on a surface of the wafer 1500. Each of the dies 1502 may be a repeating unit of a product that includes any suitable circuitry. After the fabrication of the product is complete, the wafer 1500 may undergo a singulation process in which the dies 1502 are separated from one another to provide discrete "chips" of the semiconductor product. In some embodiments, the die 1502 may include any of the IC structures 100 disclosed herein (e.g., the material of the wafer 1500 may be part of the substrate 102). In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 43) or other logic that is configured to store information in the memory devices or execute instructions stored in the memory array.

FIG. 42 is a side, cross-sectional view of an IC device assembly 1700 that may include any of the IC structures 100, IC assemblies 150, IC package supports 168, and/or ESDP structures 107 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the IC assemblies 150, IC package supports 168, and/or ESDP structures 107 disclosed herein.

In some embodiments, the circuit board 1702 may be a PCB including multiple metal layers separated from one another by layers of organic dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 42 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 42), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 42, multiple IC packages may be coupled to the package interposer 1704; indeed, additional interposers may be coupled to the package interposer 1704. The package interposer 1704 may provide an intervening substrate used to bridge the circuit board 1702 and the IC package 1720. Generally, the package interposer 1704 may spread a connection to a wider pitch or reroute a connection to a different connection. For example, the package interposer 1704 may couple the IC package 1720 to a set of ball grid array conductive contacts of the coupling components 1716 for coupling to the circuit board 1702. In the embodiment illustrated in FIG. 42, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers (PAs), power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 42 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

FIG. 43 is a block diagram of an example electrical device 1800 that may include one or more IC structures 100, IC assemblies 150, IC package supports 168, and/or ESDP structures 107, in accordance with any of the embodiments disclosed herein. For example, any suitable ones of the components of the electrical device 1800 may include one or more of the IC device assemblies 1700 or dies 1502 disclosed herein. A number of components are illustrated in FIG. 43 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 43, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include communication circuitry 1812. For example, the communication circuitry 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication circuitry 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication circuitry 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication circuitry 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication circuitry 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication circuitry 1812 may operate in accordance with other wireless protocols in other embodiments. The electrical device 1800 may include an antenna 1822 to facilitate wireless communications and/or to receive other wireless communications (such as AM or FM radio transmissions). The communication circuitry 1812 may include any of the IC structures 100, IC assemblies 150, IC package supports 168, and/or ESDP structures 107 disclosed herein.

In some embodiments, the communication circuitry 1812 may manage wired communications, such as electrical, optical, or any other suitable communication protocols (e.g., the Ethernet). As noted above, the communication circuitry 1812 may include multiple communication chips. For instance, a first communication circuitry 1812 may be dedicated to shorter-range wireless communications such as Wi-Fi or Bluetooth, and a second communication circuitry 1812 may be dedicated to longer-range wireless communications such as global positioning system (GPS), EDGE, GPRS, CDMA, WiMAX, LTE, EV-DO, or others. In some embodiments, a first communication circuitry 1812 may be dedicated to wireless communications, and a second communication circuitry 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package support, including: a first conductive structure in a dielectric material; a second conductive structure in the dielectric material; and a material in contact with the first conductive structure and the second conductive structure, wherein the material includes a polymer, and the material is different from the dielectric material.

Example 2 includes the subject matter of Example 1, and further specifies that the dielectric material includes an organic material.

Example 3 includes the subject matter of any of Examples 1-2, and further specifies that the material includes a polymer voltage suppression material.

Example 4 includes the subject matter of any of Examples 1-3, and further specifies that the material provides a structure, electrically between the first conductive structure and the second conductive structure, that has a trigger voltage between 2 volts and 10 volts.

Example 5 includes the subject matter of any of Examples 1-4, and further specifies that the first conductive structure and the second conductive structure are in a same layer of the dielectric material.

Example 6 includes the subject matter of Example 5, and further specifies that the material is at least partially coplanar with the first conductive structure and the second conductive structure.

Example 7 includes the subject matter of any of Examples 5-6, and further specifies that the first conductive structure extends at least partially around the second conductive structure.

Example 8 includes the subject matter of any of Examples 5-7, and further specifies that the first conductive structure extends entirely around the second conductive structure.

Example 9 includes the subject matter of any of Examples 5-8, and further specifies that a distance between the first conductive structure and the second conductive structure in a region of the material is less than a distance between the first conductive structure and the second conductive structure in a region away from the material.

Example 10 includes the subject matter of any of Examples 5-9, and further specifies that the first conductive structure includes a protrusion that extends toward the second conductive structure.

Example 11 includes the subject matter of any of Examples 5-10, and further includes: a third conductive structure, wherein the first conductive structure is between the first conductive structure and the second conductive structure.

Example 12 includes the subject matter of Example 11, and further specifies that a portion of the material is in contact with the first conductive structure and the third conductive structure.

Example 13 includes the subject matter of any of Examples 11-12, and further specifies that a distance between the first conductive structure and the third conductive structure in a region of the portion of the material is less than a distance between the first conductive structure and the third conductive structure in a region away from the portion of the material.

Example 14 includes the subject matter of any of Examples 11-13, and further specifies that the first conductive structure includes a protrusion that extends toward the third conductive structure.

Example 15 includes the subject matter of any of Examples 1-4, and further specifies that the first conductive structure and the second conductive structure are in different layers of the dielectric material.

Example 16 includes the subject matter of Example 15, and further specifies that a distance between the first conductive structure and the second conductive structure in a region of the material is less than a distance between the first conductive structure and the second conductive structure in a region away from the material.

Example 17 includes the subject matter of any of Examples 15-16, and further specifies that a width of the first conductive structure in a region of the material is less than a width of the first conductive structure in a region away from the material.

Example 18 includes the subject matter of any of Examples 15-17, and further specifies that the first conductive structure includes a protrusion that extends toward the second conductive structure.

Example 19 includes the subject matter of any of Examples 1-18, and further specifies that the first conductive structure includes a conductive line and the second conductive structure includes a conductive line.

Example 20 includes the subject matter of any of Examples 1-19, and further specifies that the first conductive structure is a signal structure and the second conductive structure is a ground structure.

Example 21 includes the subject matter of any of Examples 1-19, and further specifies that the first conductive structure is a ground structure and the second conductive structure is a signal structure.

Example 22 includes the subject matter of any of Examples 1-21, and further includes: a third conductive structure in a dielectric material; and a fourth conductive structure in the dielectric material; and wherein a portion of the material is also in contact with the third conductive structure and the fourth conductive structure.

Example 23 includes the subject matter of any of Examples 1-22, and further specifies that the IC package support is a package substrate.

Example 24 includes the subject matter of any of Examples 1-22, and further specifies that the IC package support is an interposer.

Example 25 includes the subject matter of any of Examples 1-22, and further specifies that the IC package support is a bridge.

Example 26 is an integrated circuit (IC) package, including a die and an IC package support coupled to the die, wherein the IC package support includes: a first conductive structure in a dielectric material; a second conductive structure in the dielectric material; and a material in contact with the first conductive structure and the second conductive structure, wherein the material provides a structure, electrically between the first conductive structure and the second conductive structure, that has a trigger voltage between 2 volts and 10 volts, and the material is different from the dielectric material.

Example 27 includes the subject matter of Example 26, and further specifies that the die is coupled to the IC package support by solder.

Example 28 includes the subject matter of any of Examples 26-27, and further specifies that the die includes a diode.

Example 29 includes the subject matter of any of Examples 26-28, and further includes: a diode coupled to the IC package support.

Example 30 includes the subject matter of any of Examples 26-29, and further specifies that the dielectric material includes an organic material.

Example 31 includes the subject matter of any of Examples 26-30, and further specifies that the material includes a polymer voltage suppression material.

Example 32 includes the subject matter of any of Examples 26-31, and further includes: a surface dielectric material between the first conductive structure and the die.

Example 33 includes the subject matter of any of Examples 26-32, and further specifies that the first conductive structure and the second conductive structure are in a same layer of the dielectric material.

Example 34 includes the subject matter of Example 33, and further specifies that the material is at least partially coplanar with the first conductive structure and the second conductive structure.

Example 35 includes the subject matter of any of Examples 33-34, and further specifies that the first conductive structure extends at least partially around the second conductive structure.

Example 36 includes the subject matter of any of Examples 33-35, and further specifies that the first conductive structure extends entirely around the second conductive structure.

Example 37 includes the subject matter of any of Examples 33-36, and further specifies that a distance between the first conductive structure and the second conductive structure in a region of the material is less than a distance between the first conductive structure and the second conductive structure in a region away from the material.

Example 38 includes the subject matter of any of Examples 33-37, and further specifies that the first conductive structure includes a protrusion that extends toward the second conductive structure.

Example 39 includes the subject matter of any of Examples 33-38, and further specifies that the IC package support further includes: a third conductive structure, wherein the first conductive structure is between the first conductive structure and the second conductive structure.

Example 40 includes the subject matter of Example 39, and further specifies that a portion of the material is in contact with the first conductive structure and the third conductive structure.

Example 41 includes the subject matter of any of Examples 39-40, and further specifies that a distance between the first conductive structure and the third conductive structure in a region of the portion of the material is less than a distance between the first conductive structure and the third conductive structure in a region away from the portion of the material.

Example 42 includes the subject matter of any of Examples 39-41, and further specifies that the first conductive structure includes a protrusion that extends toward the third conductive structure.

Example 43 includes the subject matter of any of Examples 26-42, and further specifies that the first conductive structure and the second conductive structure are in different layers of the dielectric material.

Example 44 includes the subject matter of Example 43, and further specifies that a distance between the first conductive structure and the second conductive structure in a region of the material is less than a distance between the first conductive structure and the second conductive structure in a region away from the material.

Example 45 includes the subject matter of any of Examples 43-44, and further specifies that a width of the first conductive structure in a region of the material is less than a width of the first conductive structure in a region away from the material.

Example 46 includes the subject matter of any of Examples 43-45, and further specifies that the first conductive structure includes a protrusion that extends toward the second conductive structure.

Example 47 includes the subject matter of any of Examples 26-46, and further specifies that the first conductive structure includes a conductive line and the second conductive structure includes a conductive line.

Example 48 includes the subject matter of any of Examples 26-47, and further specifies that the first conductive structure is a signal structure and the second conductive structure is a ground structure.

Example 49 includes the subject matter of any of Examples 26-47, and further specifies that the first conductive structure is a ground structure and the second conductive structure is a signal structure.

Example 50 includes the subject matter of any of Examples 26-49, and further specifies that the IC package support further includes: a third conductive structure in a dielectric material; and a fourth conductive structure in the dielectric material; and wherein a portion of the material is also in contact with the third conductive structure and the fourth conductive structure.

Example 51 includes the subject matter of any of Examples 26-50, and further specifies that the IC package support is a package substrate.

Example 52 includes the subject matter of any of Examples 26-50, and further specifies that the IC package support is an interposer.

Example 53 includes the subject matter of any of Examples 26-50, and further specifies that the IC package support is a bridge.

Example 54 includes the subject matter of Example 53, and further specifies that the bridge is an embedded bridge, and the IC package further includes a package substrate in which the bridge is embedded.

Example 55 is a computing device, including: an integrated circuit (IC) package including an IC package support, wherein the IC package support includes a first conductive structure, a second conductive structure, a dielectric material between the first conductive structure and the second conductive structure in a region; and a material in contact with the first conductive structure and the second conductive structure in another region, wherein the material is different from the dielectric material, the material acts as a dielectric material below a trigger voltage, and the material reversibly acts as a conductive material above the trigger voltage; and a circuit board coupled to the IC package.

Example 56 includes the subject matter of Example 55, and further specifies that the IC package further includes a die coupled to the IC package support.

Example 57 includes the subject matter of any of Examples 55-56, and further specifies that the die is coupled to the IC package support by solder.

Example 58 includes the subject matter of any of Examples 56-57, and further specifies that the die includes a diode.

Example 59 includes the subject matter of any of Examples 55-59, and further specifies that the IC package further includes a diode coupled to the IC package support.

Example 60 includes the subject matter of any of Examples 55-59, and further specifies that the dielectric material includes an organic material.

Example 61 includes the subject matter of any of Examples 55-60, and further specifies that the material includes a polymer voltage suppression material.

Example 62 includes the subject matter of any of Examples 55-61, and further includes: a surface dielectric material between the first conductive structure and the die.

Example 63 includes the subject matter of any of Examples 55-62, and further specifies that the first conductive structure and the second conductive structure are in a same layer of the dielectric material.

Example 64 includes the subject matter of Example 63, and further specifies that the material is at least partially coplanar with the first conductive structure and the second conductive structure.

Example 65 includes the subject matter of any of Examples 63-64, and further specifies that the first conductive structure extends at least partially around the second conductive structure.

Example 66 includes the subject matter of any of Examples 63-65, and further specifies that the first conductive structure extends entirely around the second conductive structure.

Example 67 includes the subject matter of any of Examples 63-66, and further specifies that a distance between the first conductive structure and the second conductive structure in a region of the material is less than a distance between the first conductive structure and the second conductive structure in a region away from the material.

Example 68 includes the subject matter of any of Examples 63-67, and further specifies that the first conductive structure includes a protrusion that extends toward the second conductive structure.

Example 69 includes the subject matter of any of Examples 63-68, and further specifies that the IC package support further includes: a third conductive structure, wherein the first conductive structure is between the first conductive structure and the second conductive structure.

Example 70 includes the subject matter of Example 69, and further specifies that a portion of the material is in contact with the first conductive structure and the third conductive structure.

Example 71 includes the subject matter of any of Examples 69-70, and further specifies that a distance between the first conductive structure and the third conductive structure in a region of the portion of the material is less than a distance between the first conductive structure and the third conductive structure in a region away from the portion of the material.

Example 72 includes the subject matter of any of Examples 69-71, and further specifies that the first conductive structure includes a protrusion that extends toward the third conductive structure.

Example 73 includes the subject matter of any of Examples 55-62, and further specifies that the first conductive structure and the second conductive structure are in different layers of the dielectric material.

Example 74 includes the subject matter of Example 73, and further specifies that a distance between the first conductive structure and the second conductive structure in a region of the material is less than a distance between the first conductive structure and the second conductive structure in a region away from the material.

Example 75 includes the subject matter of any of Examples 73-74, and further specifies that a width of the first conductive structure in a region of the material is less than a width of the first conductive structure in a region away from the material.

Example 76 includes the subject matter of any of Examples 73-75, and further specifies that the first conductive structure includes a protrusion that extends toward the second conductive structure.

Example 77 includes the subject matter of any of Examples 55-76, and further specifies that the first conductive structure includes a conductive line and the second conductive structure includes a conductive line.

Example 78 includes the subject matter of any of Examples 55-77, and further specifies that the first conductive structure is a signal structure and the second conductive structure is a ground structure.

Example 79 includes the subject matter of any of Examples 55-77, and further specifies that the first conductive structure is a ground structure and the second conductive structure is a signal structure.

Example 80 includes the subject matter of any of Examples 55-79, and further specifies that the IC package support further includes: a third conductive structure in a dielectric material; and a fourth conductive structure in the dielectric material; and wherein a portion of the material is also in contact with the third conductive structure and the fourth conductive structure.

Example 81 includes the subject matter of any of Examples 55-80, and further specifies that the IC package support is a package substrate.

Example 82 includes the subject matter of any of Examples 55-80, and further specifies that the IC package support is an interposer.

Example 83 includes the subject matter of any of Examples 55-80, and further specifies that the IC package support is a bridge.

Example 84 includes the subject matter of Example 83, and further specifies that the bridge is an embedded bridge, and the IC package further includes a package substrate in which the bridge is embedded.

Example 85 includes the subject matter of any of Examples 55-84, and further specifies that the circuit board is a motherboard.

Example 86 includes the subject matter of any of Examples 55-85, and further includes: an antenna electrically coupled to the circuit board.

Example 87 includes the subject matter of any of Examples 55-86, and further includes: a display device electrically coupled to the circuit board.

Example 88 includes the subject matter of any of Examples 55-87, and further specifies that the computing device is a handheld computing device.

Example 89 includes the subject matter of any of Examples 55-87, and further specifies that the computing device is a wearable computing device.

Example 90 includes the subject matter of any of Examples 55-87, and further specifies that the computing device is a server computing device.

The invention claimed is:

1. An integrated circuit (IC) package support, comprising:
a plurality of interconnect layers in a dielectric material;
a first conductive structure in the dielectric material;
a second conductive structure in the dielectric material; and
a material in contact with the first conductive structure and the second conductive structure, wherein:
the package support is configured to mechanically and electrically couple with a semiconductor IC die on at least one of two opposing surfaces of the package support,
the material includes a polymer different from the dielectric material,
the first conductive structure includes a protrusion that extends toward the second conductive structure in a region of the material proximate to the first conductive structure and the second conductive structure, and
the protrusion does not touch the second conductive structure.

2. The IC package support of claim 1, wherein the dielectric material includes an organic material.

3. The IC package support of claim 1, wherein the material includes a polymer voltage suppression material.

4. The IC package support of claim 1, wherein the material provides a structure, electrically between the first conductive structure and the second conductive structure, that has a trigger voltage between 2 volts and 10 volts.

5. The IC package support of claim 1, wherein the first conductive structure and the second conductive structure are in a same layer of the dielectric material.

6. The IC package support of claim 5, wherein the material is at least partially coplanar with the first conductive structure and the second conductive structure.

7. The IC package support of claim 5, wherein a distance between the first conductive structure and the second conductive structure in a region of the material is less than a distance between the first conductive structure and the second conductive structure in a region away from the material.

8. The IC package support of claim 1, wherein the first conductive structure and the second conductive structure are in different layers of the dielectric material.

9. The IC package support of claim 8, wherein a distance between the first conductive structure and the second conductive structure in a region of the material is less than a distance between the first conductive structure and the second conductive structure in a region away from the material.

10. The IC package support of claim 8, wherein a width of the first conductive structure in a region of the material is less than a width of the first conductive structure in a region away from the material.

11. The IC package support of claim 1, wherein the IC package support is a package substrate, an interposer, or a bridge.

12. An integrated circuit (IC) package, comprising:
a die; and
an IC package support electrically and mechanically coupled to the die on at least one of two opposing surfaces of the package support, wherein the IC package support includes:
a plurality of interconnect layers in a dielectric material;
a first conductive structure in the dielectric material;
a second conductive structure in the dielectric material; and
a material in contact with the first conductive structure and the second conductive structure, wherein:
the material provides a structure, electrically between the first conductive structure and the second conductive structure, that has a trigger voltage between 2 volts and 10 volts,
the material is different from the dielectric material, the first conductive structure includes a protrusion that extends toward the second conductive structure in a region of the material proximate to the first conductive structure and the second conductive structure, and the protrusion does not touch the second conductive structure.

13. The IC package of claim 12, wherein the die is coupled to the IC package support by solder.

14. The IC package of claim 12, wherein the first conductive structure includes a conductive line and the second conductive structure includes a conductive line.

15. The IC package of claim 12, wherein the first conductive structure is a signal structure and the second conductive structure is a ground structure.

16. A computing device, comprising: an integrated circuit (IC) package including an IC package support, wherein the IC package support includes a plurality of interconnect layers in a dielectric material, wherein the package support is configured to mechanically and electrically couple with an IC die on at least one of two opposing surfaces of the package support, a first conductive structure, a second conductive structure, the dielectric material between the first conductive structure and the second conductive structure in a region; and a material in contact with the first conductive structure and the second conductive structure in another region, wherein the material is different from the dielectric material, the material acts as an insulator below a trigger voltage, the material reversibly acts as a conductor above the trigger voltage, the first conductive structure includes a protrusion that extends toward the second conductive structure in the another region of the material proximate to the first conductive structure and the second conductive structure, and the protrusion does not touch the second conductive structure; and a circuit board coupled to the IC package.

17. The computing device of claim 16, wherein the circuit board is a motherboard.

18. The computing device of claim 16, further comprising:

an antenna electrically coupled to the circuit board, or a display device electrically coupled to the circuit board.

19. The computing device of claim 16, wherein the computing device is a handheld computing device, a wearable computing device, or a server computing device.

* * * * *